US 10,948,072 B2

(12) United States Patent
Sone et al.

(10) Patent No.: US 10,948,072 B2
(45) Date of Patent: Mar. 16, 2021

(54) CONTROL CIRCUIT DEVICE FOR AUTOMATIC TRANSMISSION

(71) Applicants: AutoNetworks Technologies, Ltd., Mie (JP); Sumitomo Wiring Systems, Ltd., Mie (JP); SUMITOMO ELECTRIC INDUSTRIES, LTD., Osaka (JP)

(72) Inventors: Kosuke Sone, Mie (JP); Satoshi Yamamoto, Mie (JP); Yasuto Takeda, Mie (JP); Tsutomu Hashimoto, Mie (JP); Yosuke Shiratsuka, Mie (JP); Koji Ebisu, Mie (JP)

(73) Assignees: AutoNetworks Technologies, Ltd.; Sumitomo Wiring Systems, Ltd.; Sumitomo Electric Industries, Ltd.

(*) Notice: Subject to any disclaimer, the term of this patent is extended or adjusted under 35 U.S.C. 154(b) by 0 days.

(21) Appl. No.: 16/348,166

(22) PCT Filed: Oct. 31, 2017

(86) PCT No.: PCT/JP2017/039266
§ 371 (c)(1),
(2) Date: May 8, 2019

(87) PCT Pub. No.: WO2018/088271
PCT Pub. Date: May 17, 2018

(65) Prior Publication Data
US 2019/0368600 A1   Dec. 5, 2019

(30) Foreign Application Priority Data

Nov. 8, 2016  (JP) .............................. JP2016-217927

(51) Int. Cl.
*H05K 7/00* (2006.01)
*F16H 61/00* (2006.01)
(Continued)

(52) U.S. Cl.
CPC ....... *F16H 61/0006* (2013.01); *B60R 16/023* (2013.01); *H01R 13/46* (2013.01); *H05K 5/03* (2013.01); *H01R 2201/26* (2013.01)

(58) Field of Classification Search
USPC ......................................................... 361/728
See application file for complete search history.

(56) References Cited

U.S. PATENT DOCUMENTS 6,443,758 B2 * 9/2002 Nagai .................... H01R 12/69
                                                    439/422
10,349,545 B2 * 7/2019 Sone ...................... H05K 5/065
(Continued)

FOREIGN PATENT DOCUMENTS

| JP | 2011-171281 | 9/2011 |
| JP | 2011-252549 | 12/2011 |
| JP | 2012-57769 | 3/2012 |

OTHER PUBLICATIONS

International Search Report dated Jan. 30, 2018.

*Primary Examiner* — Hung S. Bui
(74) *Attorney, Agent, or Firm* — Gerald E. Hespos; Michael J. Porco; Matthew T. Hespos

(57) ABSTRACT

A control circuit device for vehicle automatic transmission includes a control circuit unit having a body with a built-in control circuit for vehicle automatic transmission and tab-like terminals extending from the body while being lined in an arrangement direction. A cover covers the control circuit unit from one side in an intersection direction intersecting the arrangement direction. An insulating protection tube collectively surrounds the terminals and has partition walls to be disposed between adjacent terminals. The cover and the protection tube include locks configured to lock the cover and the protection tube to each other and positioning structures configured to position the control circuit unit. The control circuit unit is held positioned with respect to the (Continued)

cover and the protection tube with the cover and the protection tube locked by the locks.

8 Claims, 27 Drawing Sheets

(51) Int. Cl.
*B60R 16/023* (2006.01)
*H01R 13/46* (2006.01)
*H05K 5/03* (2006.01)

(56) References Cited

U.S. PATENT DOCUMENTS

2008/0200048 A1* 8/2008 Matsuura ............ H01R 12/616
439/78
2013/0148313 A1 6/2013 Nakayama et al.

* cited by examiner

CONTROL CIRCUIT DEVICE FOR AUTOMATIC TRANSMISSION

BACKGROUND

Field of the Invention

This specification relates to a control circuit device for vehicle automatic transmission and a vehicle connector.

Related Art

Japanese Unexamined Patent Publication No. 2012-57769 discloses a control circuit device for automatic transmission used in a vehicle, such as an automatic vehicle. This control circuit device is configured such that an electronic circuit body is placed on a plate-like metal base that is placed on a mounting tool and covered with a cover. The electronic circuit body and the cover are fixed by the base by bolt fastening. Terminals project out from the electronic circuit body.

The base comes in various shapes depending on a mounting location of the vehicle where the control circuit device is mounted. Thus, an assembling operation of the control circuit device is performed using a base corresponding to the vehicle at a mounting site of the control circuit device. Specifically, the electronic circuit body, the cover and the base need to be assembled at the mounting site of the control circuit device and the problem is that there are many working processes at the mounting site.

Further, the electronic circuit body is not covered by the cover before assembling carried out at the mounting site, and the terminals of the electronic circuit body are exposed during transportation. Thus, troubles such as the deformation of the terminals during transportation due to the contact of foreign matter may occur.

Furthermore, the control circuit device may be used by being disposed in oil, and conductive foreign matter, such as metal abrasion powder may be mixed in the oil. This foreign matter may enter between the terminals of the electronic circuit body or between the terminals and the metallic base to cause a short circuit.

The invention aims to provide a control circuit device for vehicle automatic transmission that can be transported with terminals protected and collectively mounted on a mounted member and in which a short circuit is unlikely to occur. Further, it is also aimed to provide a vehicle connector in which a short circuit is unlikely to occur.

SUMMARY

This specification is directed to a control circuit device for vehicle automatic transmission with a control circuit unit including a body having a built-in control circuit for a vehicle automatic transmission and tab-like terminals extending from the body while being lined in an arrangement direction. A cover is configured to cover the control circuit unit from one side in an intersection direction intersecting the arrangement direction. An insulating protection tube collectively surrounds the terminals and is provided with partition walls to be disposed between adjacent terminals. The cover and the protection tube include locking means configured to lock the cover and the protection tube to each other and positioning means configured to position the control circuit unit. The control circuit unit is held positioned with respect to the cover and the protection tube with the cover and the protection tube locked by the locking means.

According to the above configuration, the control circuit device is assembled with the control circuit unit held positioned with respect to the cover and the protection tube even if a mounted member, such as a base, is not present. In such an assembled state, the terminals of the control circuit unit are covered collectively by the protection tube. Thus, foreign matter cannot contact and deform the terminals during transportation.

Further, the control circuit unit, the cover and the protection tube that have been assembled in this way can be mounted collectively at a mounting site of the control circuit device. Thus, the number of components and the number of working steps at the mounting site can be less than before.

Further, even if the control circuit device is mounted, for example, on a metal member, the terminals are covered collectively around by the insulating protection tube and do not directly face the metal member. Thus, a short circuit between the terminals and the metal member can be prevented. Furthermore, the partition walls are disposed between adjacent terminals so that a short circuit between the terminals can also be suppressed.

The positioning means on the side of the protection tube may include the partition walls and a supporting wall configured to cover at least a part of the body from the other side in the intersection direction. Thus, the control circuit unit can be positioned with respect to the protection tube.

The body may have unit-side grooves that receive edges of the partition walls. According to this configuration, the edges of the partition walls are fit in the unit-side grooves with the control circuit unit, the cover and the protection tube assembled. Thus, a creepage distance between adjacent terminals becomes longer, and a short circuit between adjacent terminals is unlikely.

The control circuit unit may include a unit-side mounting portion configured to mount the control circuit unit on a mounted member and the cover may include a cover-side mounting portion configured to mount the cover on the mounted member. Additionally, a fastening member may collectively fasten the unit-side mounting portion and the cover-side mounting portion to the mounted member while being overlapped. Accordingly, the protection tube locked to the cover also is mounted on the mounted member by collectively fastening the cover and the control circuit unit to the mounted member by the fastening member. Further, the cover and the control circuit unit simultaneously are fixed to each other. Specifically, fixing means for fixing the cover (or the protection tube) and the control circuit unit to each other can double as mounting means for mounting the control circuit device on the mounted member. Thus, the overall configuration can be simplified and the number of working steps can be reduced.

Further, the mounting portion for the mounted member is provided on the cover different from the protection tube formed with the partition walls and having a complicated shaped. Thus, the configuration of the protection tube can be simplified and molding is easier as compared to a configuration for providing the protection tube with both the partition walls and the mounting portion.

This specification also is directed to a vehicle connector to be connected to the above control circuit device for vehicle automatic transmission. The vehicle connector includes connector-side grooves that receive end edges of the partition walls with the vehicle connector connected to the control circuit device.

According to this configuration, the creepage distance between adjacent the terminals becomes longer on the side of the vehicle connector. Thus, a short circuit between the terminals is less likely.

According to this specification, it is possible to obtain a control circuit device for vehicle automatic transmission that can be transported with terminals protected and collectively mounted on a mounted member and in which a short circuit is unlikely to occur. It is also possible to obtain a vehicle connector in which a short circuit is unlikely to occur.

DETAILED DESCRIPTION

One embodiment is described with reference to FIGS. 1 to 32.

A control circuit device 10 of this embodiment is used in an automatic transmission of a vehicle, such as an automatic vehicle. In the following description, an upper side, a lower side, a right-lower side, a left-upper side, a right-upper side and a left-lower side of FIG. 1 are referred to respectively as an upper side, a lower side, a front, a rear, a right side and a left side.

Figure 1:
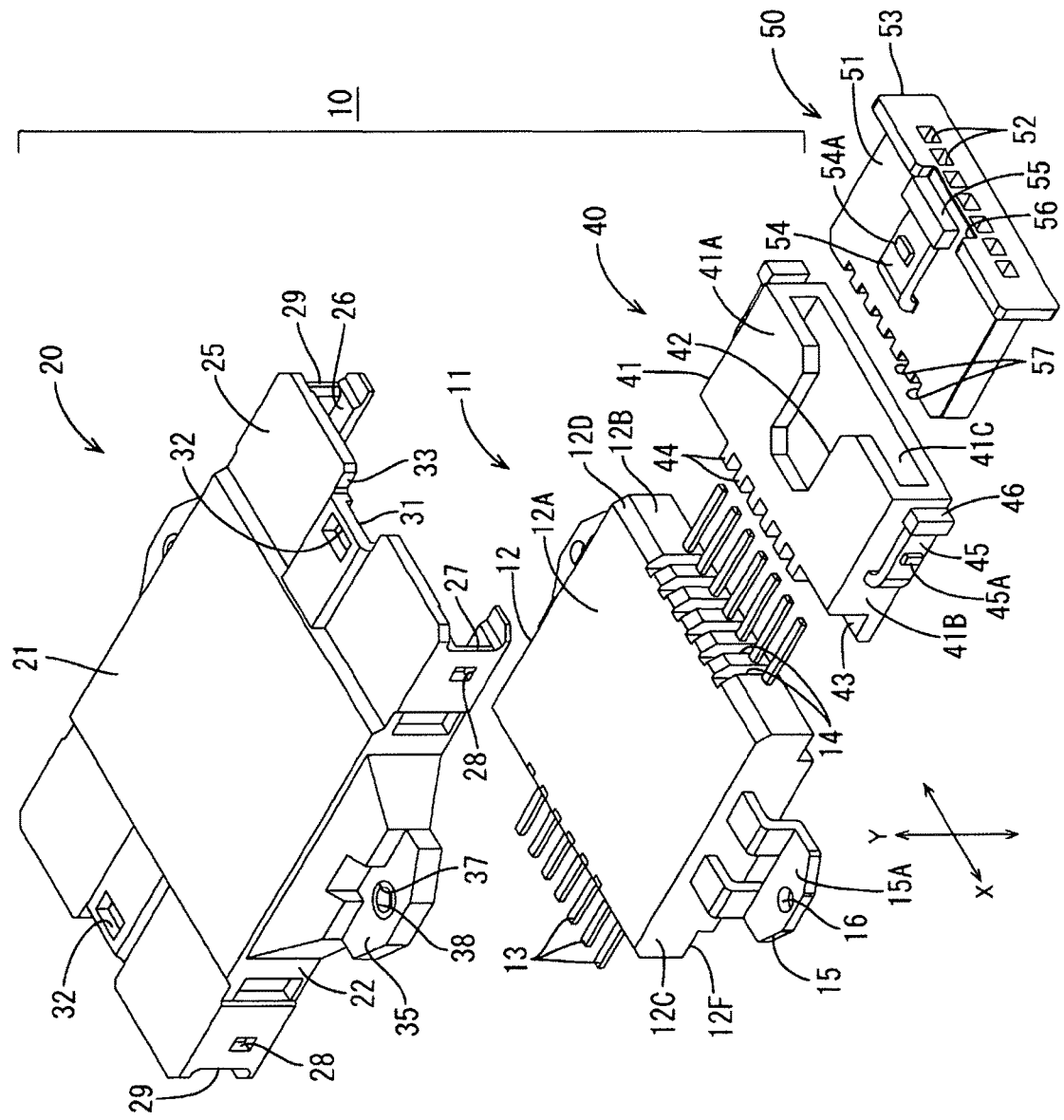
FIG. 1 is an exploded perspective view of a control circuit device and a vehicle connector of one embodiment.

As shown in FIG. 1, the control circuit device 10 includes a control circuit unit 11, a cover 20 for covering the control circuit unit 11 from above (example of one side in an intersection direction Y), and protection tubes 40 for covering terminals 13 of the control circuit unit 11.

(Control Circuit Unit 11)

The control circuit unit 11 includes a body 12 in the form of a flat housing having an unillustrated built-in control circuit and a plurality of (seven on each side surface in this embodiment) tab-like terminals 13 extending forward and rearward in a lateral (example of an arrangement direction X) row from front and rear side surfaces 12B facing each other, out of four side surfaces of the body 12.

Corners of the body 12 between an upper surface 12A and the facing side surfaces 12B are cut obliquely to form inclined surfaces 12D. Further, corners of the body 12 between a bottom surface 12E and the side surfaces 12B are cut to have an L-shaped cross-section, thereby forming steps 12F for accommodating supporting walls 43 to be described later. The terminals 13 extend from a central part of the body 12 in a height direction (see FIG. 2).

Figure 14:
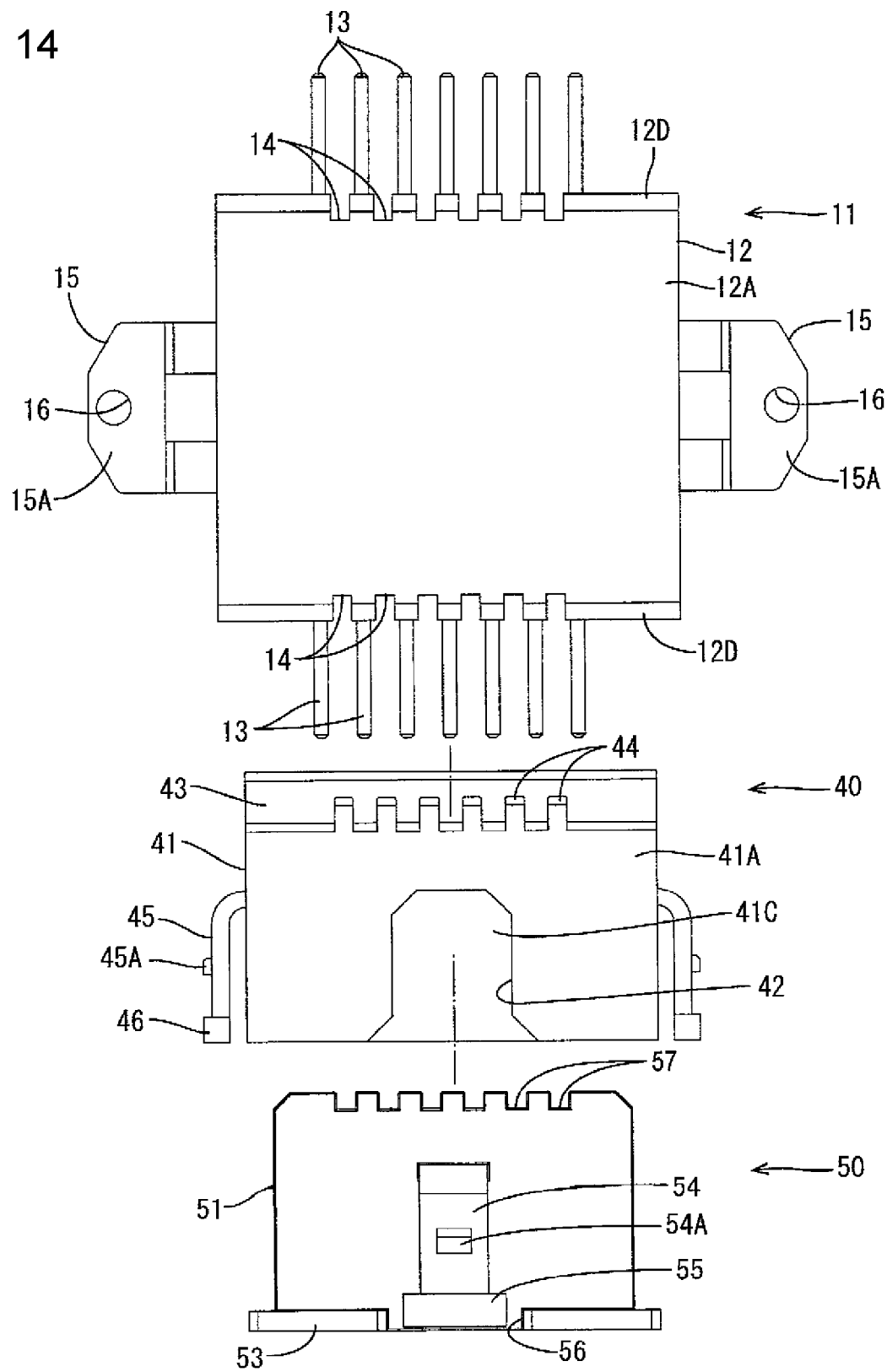
FIG. 14 is a plan view showing the process of fitting the control circuit unit, the protection tube and the vehicle connector with the cover omitted.

Unit-side grooves 14 are formed between adjacent terminals 13 on the side surfaces 12B of the body 12 entirely in the height direction. As shown in FIG. 14, a groove depth of each unit-side groove 14 is set to concavely cut an end edge (side) of the upper surface 12A of the body 12. Specifically, two facing ends (sides) of the upper surface 12A of the body 12 are in the form of comb teeth by being cut into an uneven shape by the unit-side groove portions 14. Partition walls 44 to be described later are fit into these unit-side grooves 14.

Further, two unit-side mounting portions 15 protrude transversely from left and right side surfaces 12C of the body 12 on which the terminals 13 are not provided. The unit-side mounting portion 15 is substantially U-shaped in a plan view and is bent down into a crank shape (see FIGS. 1, 8 and 14).

The lower surface of a coupling 15A extending in a front-rear direction on a tip side of the unit-side mounting portion 15 is flush with the bottom surface 12F of the body 12. Further, the coupling 15A is provided with a unit-side bolt insertion hole 16 into which a bolt 61 to be described later is inserted.

(Cover 20)

The cover 20 is made of synthetic resin, and covers the control circuit unit 11 from above (example of one side of the intersection direction Y) and in the lateral direction (from lateral sides), and is somewhat elongated in the front-rear direction as a whole. More particularly, the cover 20 includes a ceiling 21 for covering the control circuit unit 11 from above, two side walls 22 extending down from facing lateral edges of the ceiling 21 and two cover-side mounting portions 35 provided to protrude in the transverse direction from central parts of the part of side walls 22 in the front-rear direction.

Figure 2:
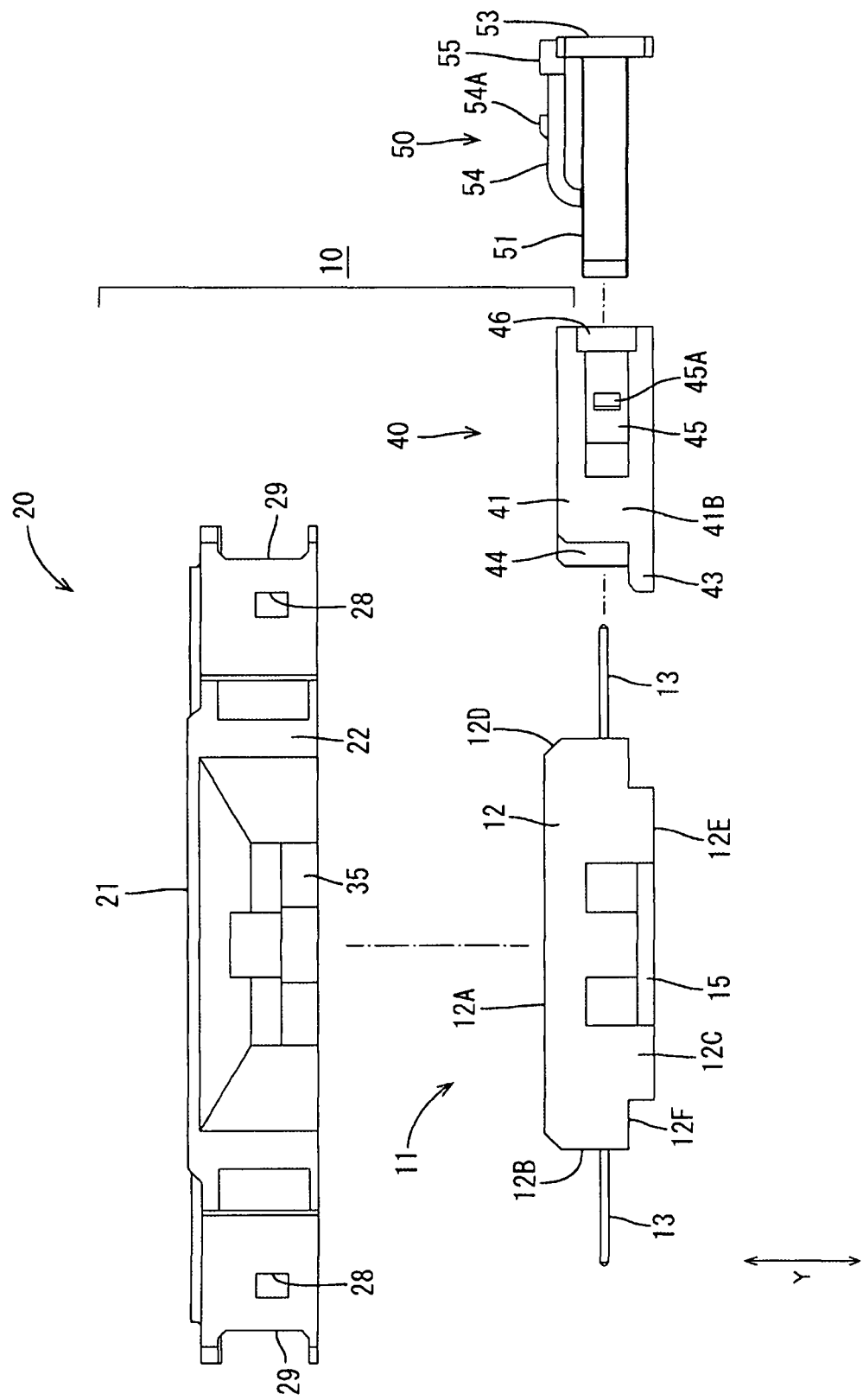
FIG. 2 is an exploded left side view of the control circuit device and the vehicle connector.
Figure 3:
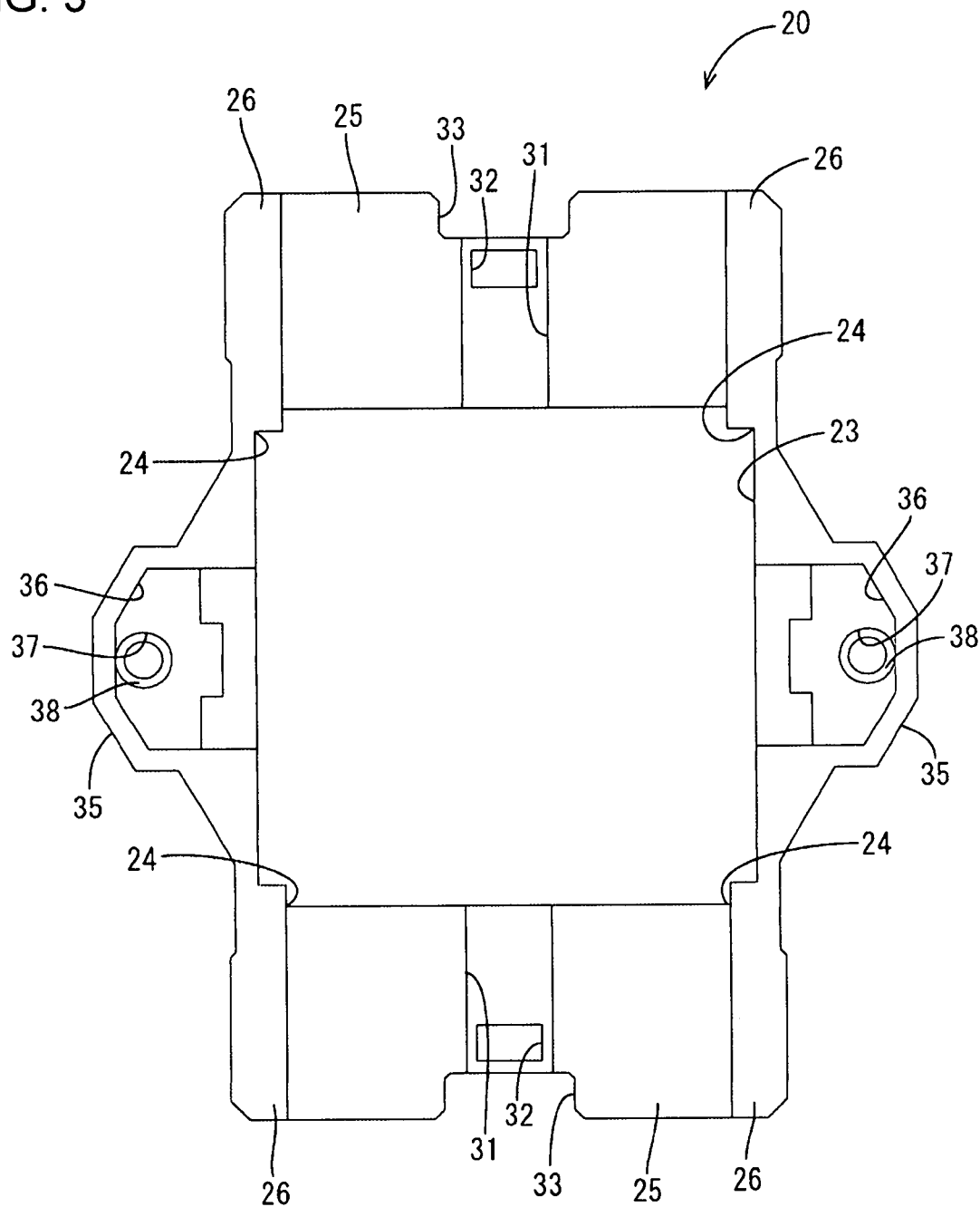
FIG. 3 is a bottom view of a cover.
Figure 4:
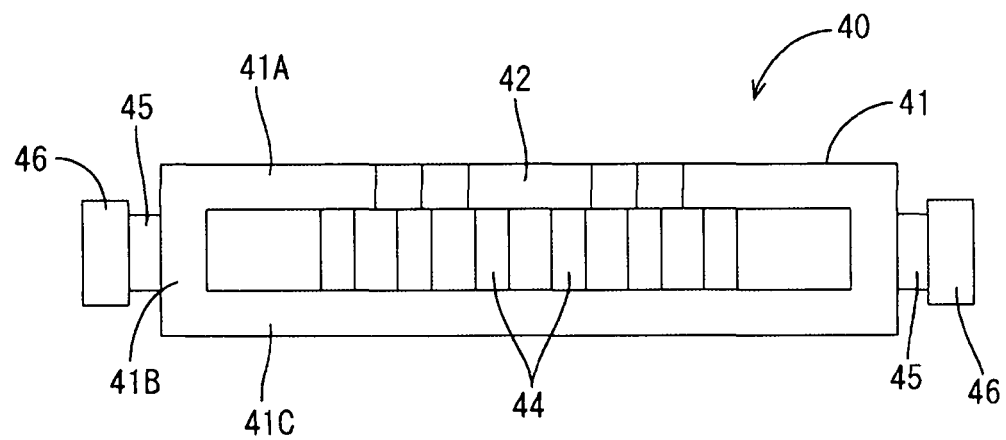
FIG. 4 is a front view of a protection tube.
Figure 5:
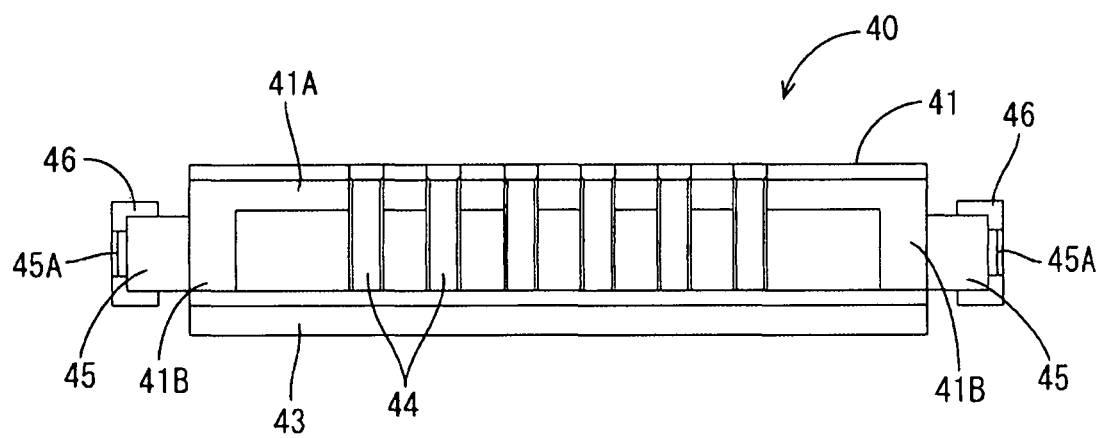
FIG. 5 is a back view of the protection tube.
Figure 6:
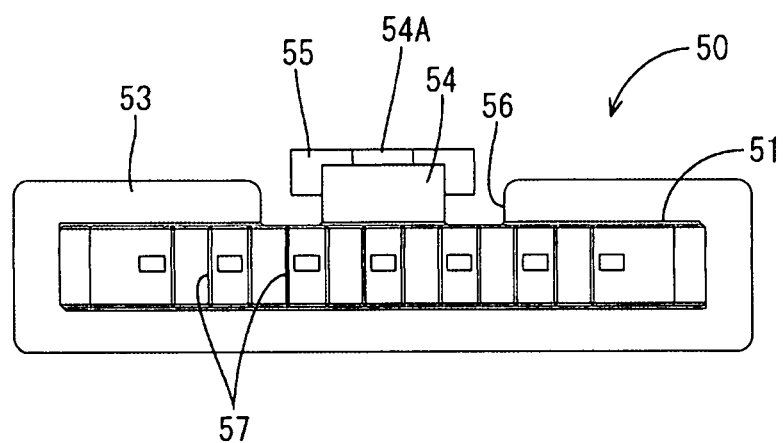
FIG. 6 is a front view of the vehicle connector.
Figure 7:
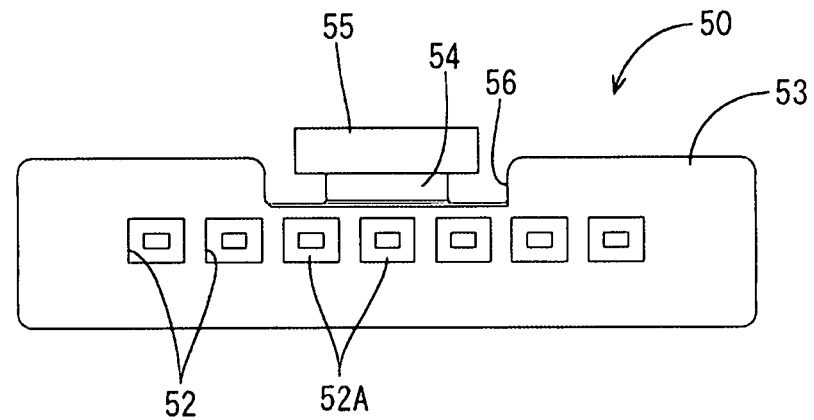
FIG. 7 is a back view of the vehicle connector.
Figure 8:
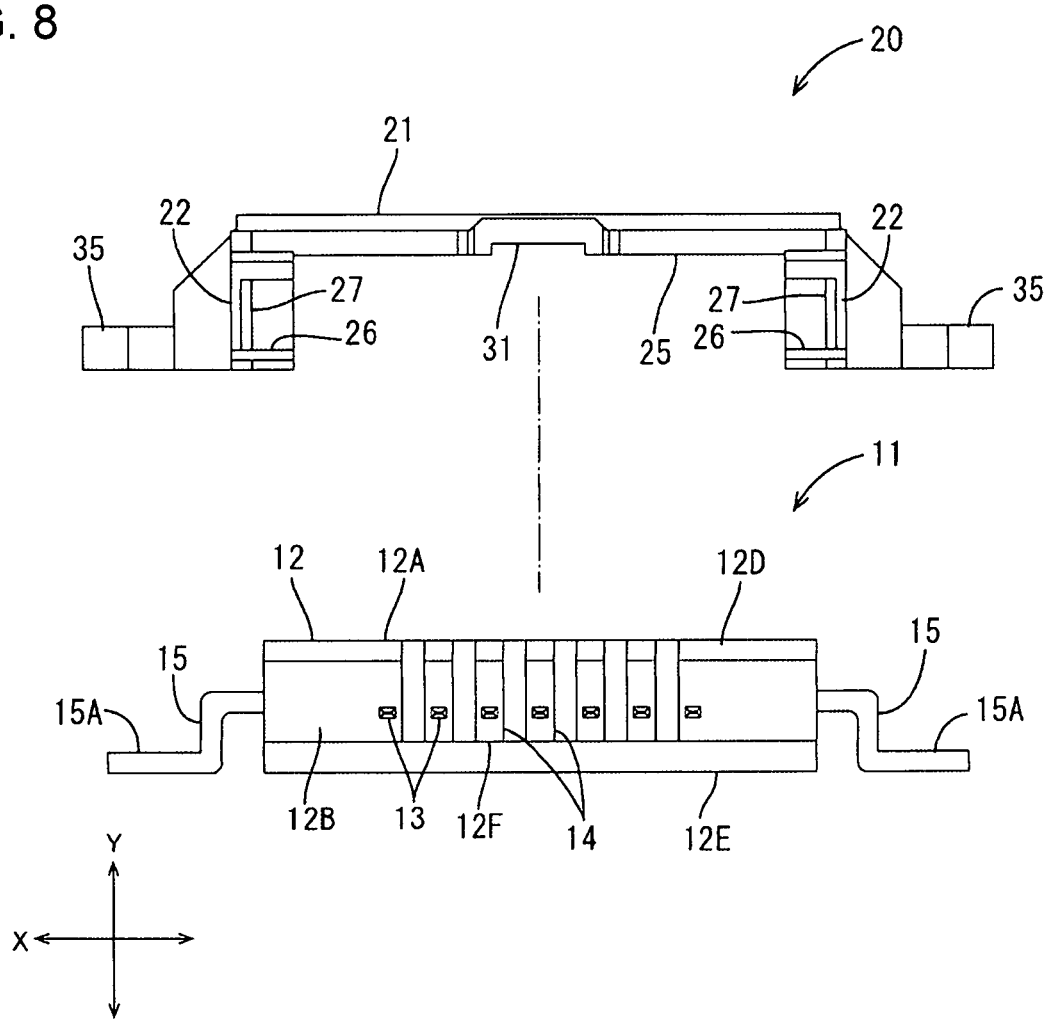
FIG. 8 is an exploded front view of a control circuit unit and the cover.
Figure 9:
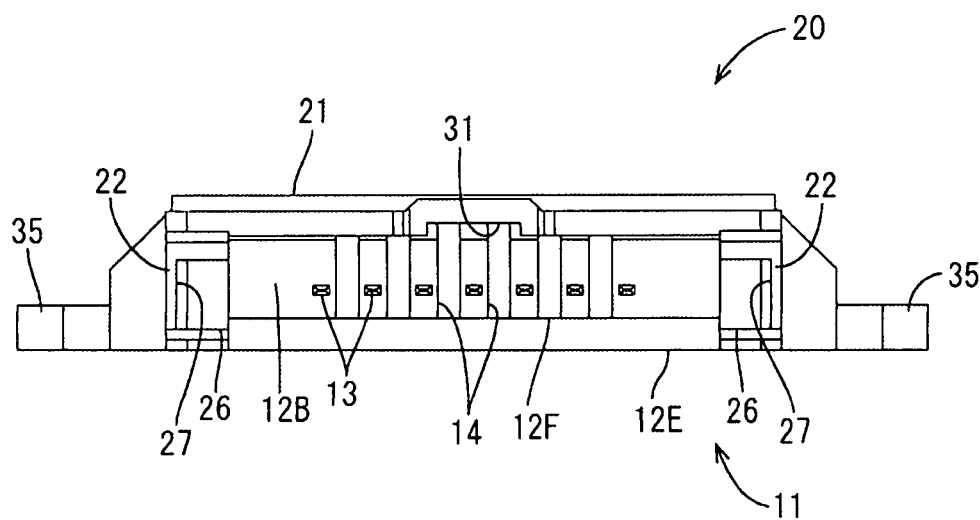
FIG. 9 is a front view of an assembled state of the control circuit unit and the cover.

As shown in FIGS. 1 and 2, a central part of the ceiling 21 in the front-rear direction is raised up in a stepped manner to form an accommodation recess 23 into which the body 12 of the control circuit unit 11 is fit (see FIG. 3).

The accommodation recess 23 includes four positioning corners 24 (example of positioning means) for positioning the body 12 by having four corners of the body 12 of the control circuit unit 11 fit therein. These positioning corners 24 are formed by changing a lateral width of the accommodation recess 23 in a stepped manner at predetermined positions.

Parts in front of and behind the accommodation recess 23 serve as protection tube holding portions 25 for covering the protection tubes 40 from above (example of the one side of the intersection direction Y) and from lateral sides to hold the protection tubes 40. Guide walls 26 protrude in from lower parts of the front and rear ends of the side walls 22 to the positioning corners 24 of the accommodation recess 23 (see FIGS. 1 and 3), and concave parts surrounded by these guide walls 26, the side walls 22 and the ceiling 21 serve as first accommodation grooves 27 for accommodating lock arms 45 of the protection tubes 40 to be described later. Rectangular first lock holes 28 penetrate through the side walls 22 in bottom parts of these first accommodation grooves 27 and form locking means for locking lock protrusions 45A of the lock arms 45.

Note that front and rear end edges of the side walls 22 on opening sides of the bottom parts of these four first accommodation grooves 27 are cut concavely to form first cutout recesses 29, and protruding portions 46 of the lock arms 45 of the protection tubes 40 are accommodated into these concave parts.

As shown in FIG. 3, two second accommodation grooves 31 are formed on the underside of the ceiling wall 21 and extend in the front-rear direction from widthwise central parts of the front and rear end edges. The second accommodation grooves 31 accommodate connector-side lock arms 54 of vehicle connectors 50 to be described later. Further, rectangular second lock holes 32 penetrate through the ceiling 21 in bottom parts of these second accommodation grooves 31 and engage lock protrusions 54A of the connector-side lock arms 54 to be described later.

Note that front and rear ends of the ceiling 21 on opening sides of the bottom parts of the second accommodation grooves 31 are cut concavely to form second cutout recesses 33, and protruding portions 55 of the vehicle connectors 50 to be described later are accommodated into these second cutout recesses 33.

Central parts of the side walls 22 in the front-rear direction are cut, and the cover-side mounting portions 35 protrude in the transverse direction (lateral direction) in these cut parts. The cover-side mounting portions 35 are dimensioned to cover the unit-side mounting portions 15 from above and lateral sides and accommodate the unit-side mounting portions 15 inside in a state where the cover 20 is covering the control circuit unit 11.

More specifically, as shown in FIG. 3, the cover-side mounting portions 35 include mounting/accommodating portions 36 (example of positioning means) into which the unit-side mounting portions 15 are fit. Further, cover-side bolt insertion holes 37 are provided at positions corresponding to the unit-side bolt insertion holes 16 of the control circuit unit 11. Collars 38 made of metal are fit into these cover-side bolt insertion holes 37.

(Protection Tubes 40)

The protection tubes 40 are provided on each of both front and rear sides of the control circuit unit 11, but the protection tube 40 on the front (right-lower side) shown in FIG. 1 is described here for the convenience of description. The upper, lower, right-lower, left-upper, right-upper and left-lower sides of the protection tube 40 of FIG. 1 are respectively referred to as the upper, lower, front, rear, right and left sides.

Each protection tube 40 is made of (insulating) synthetic resin, surrounds and covers the terminals 13 of the control circuit unit 11 along an axial direction, and includes a tubular portion 41 in the form of a flat rectangular parallelepiped open in the front-rear direction.

An upper wall 41A of the tubular portion 41 is cut rearward from a front end in a widthwise central part to form an escaping portion 42. The connector-side lock arm 54 of the vehicle connector 50 to be described later is allowed to escape into this escaping portion 42.

The supporting wall 43 to be fit to the step 12F of the control circuit unit 11 extends rearward over the entire width on the rear end edge (left side of FIG. 2, upper side of FIG. 11) of a bottom wall 41C of the tubular portion 41.

Note that a length of the tubular portion 41 in the front-rear direction is longer than a length of the terminals 13.

Figure 11:
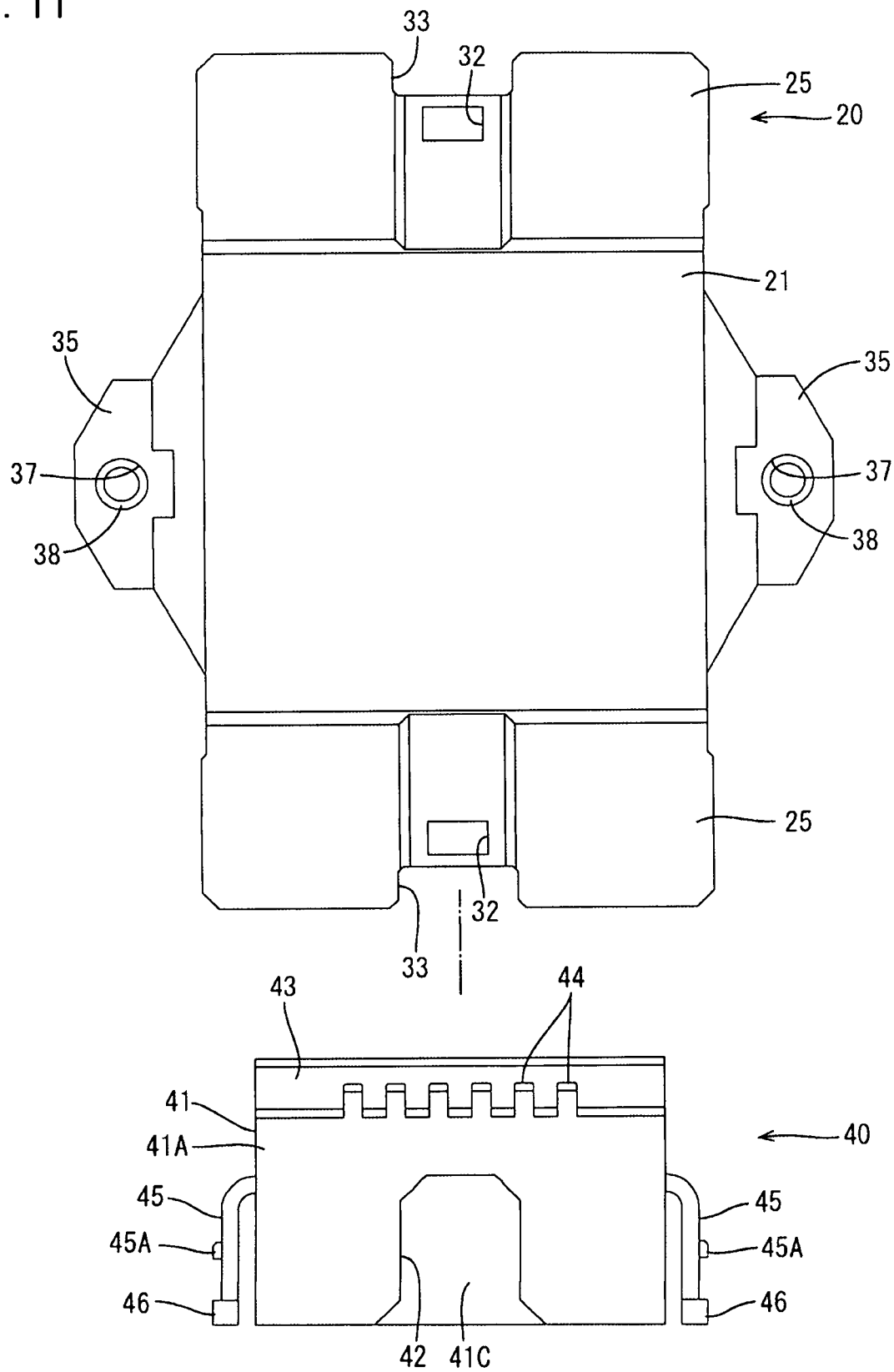
FIG. 11 is a plan view showing the process of fitting the cover and the control circuit unit in the assembled state and the protection tube.

The lock arms 45 are cantilevered forward (right side of FIG. 2, lower side of FIG. 11) from substantially central longitudinal parts of left and right side walls 41B of the tubular portion 41 (see FIGS. 2 and 11). Each lock arm 45 is provided with the lock protrusion 45A to be locked into the first lock hole 28 of the cover 20 (example of locking means).

The protruding portion 46 protrudes out on a free front end part of the lock arm 45. The protruding portion 46 is used to unlock the lock arm 45. The front surface of each protruding portion 46 is flush with the front end surface of the tubular portion 41 (see FIGS. 2 and 11).

The protection tube 40 of this embodiment is provided with the plate-like partition walls 44 (six for each protection tube 40 in this embodiment) at positions corresponding to the unit-side grooves 14 of the body 12, i.e. at positions between adjacent terminals 13 when the protection tube 40 is assembled with the control circuit unit 11 (covering the terminals 13). Plate surfaces of the partition walls 44 face in the lateral direction.

Figure 19:
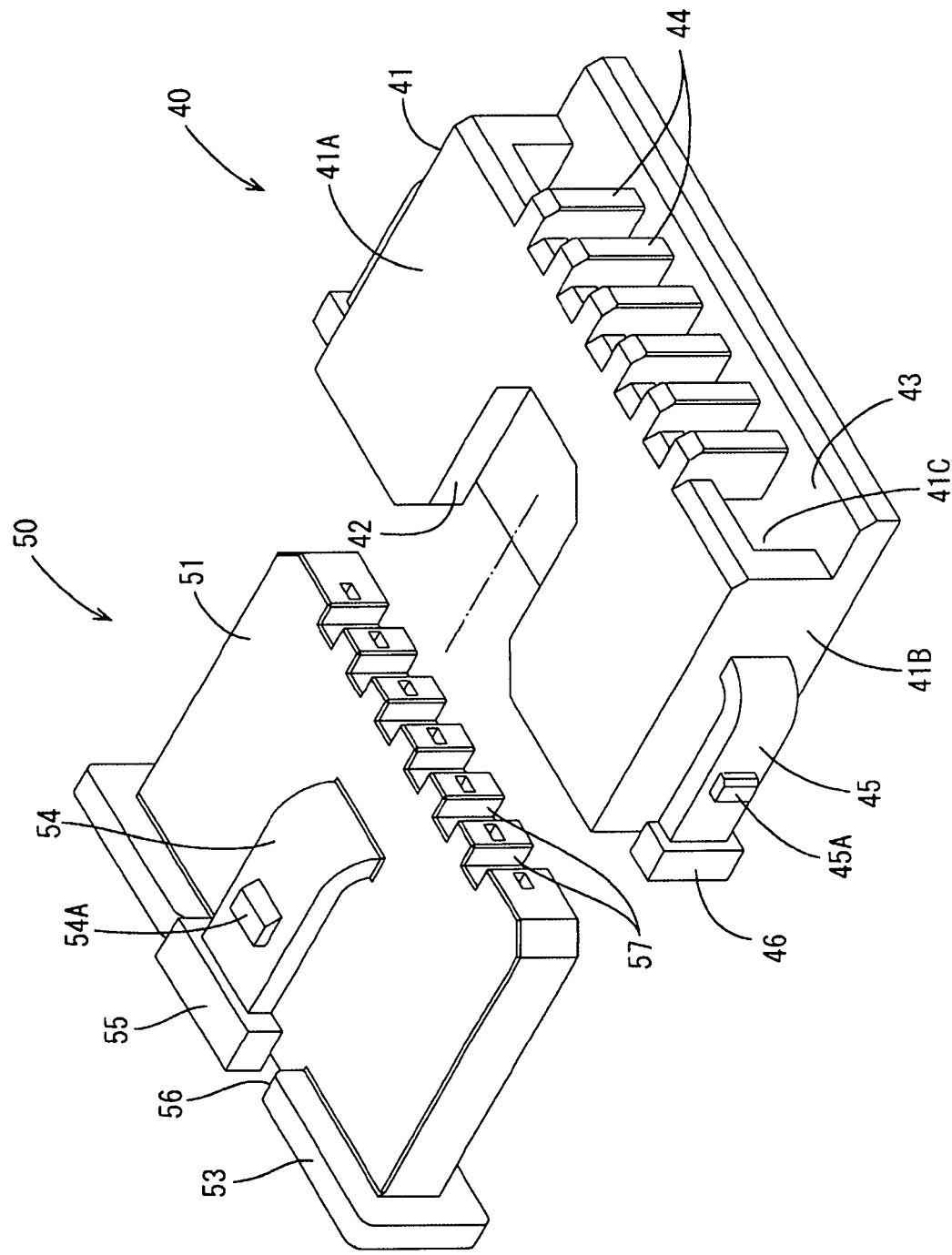
FIG. 19 is a perspective view showing the process of fitting the protection tube and the vehicle connector with the cover and the control circuit unit omitted.

More particularly, for example, as shown in FIG. 19, the partition walls 44 vertically extend to bridge the upper wall 41A, the bottom wall 41C and the supporting wall 43 of the tubular portion 41. Specifically, the partition walls 44 are disposed at positions such that front edges (left-upper side of FIG. 19) are in the tubular portion 41 and rear edges (right-lower side of FIG. 19) project from the tubular portion 41. Thus, the rear end of the upper wall 41A is formed into a comb teeth-like uneven shape. The partition walls 44 hold adjacent the terminals 13 in a mutually insulated state by entering spaces between the terminals 13 from the front of the control circuit unit 11 (see FIGS. 14 to 16).

Figure 16:
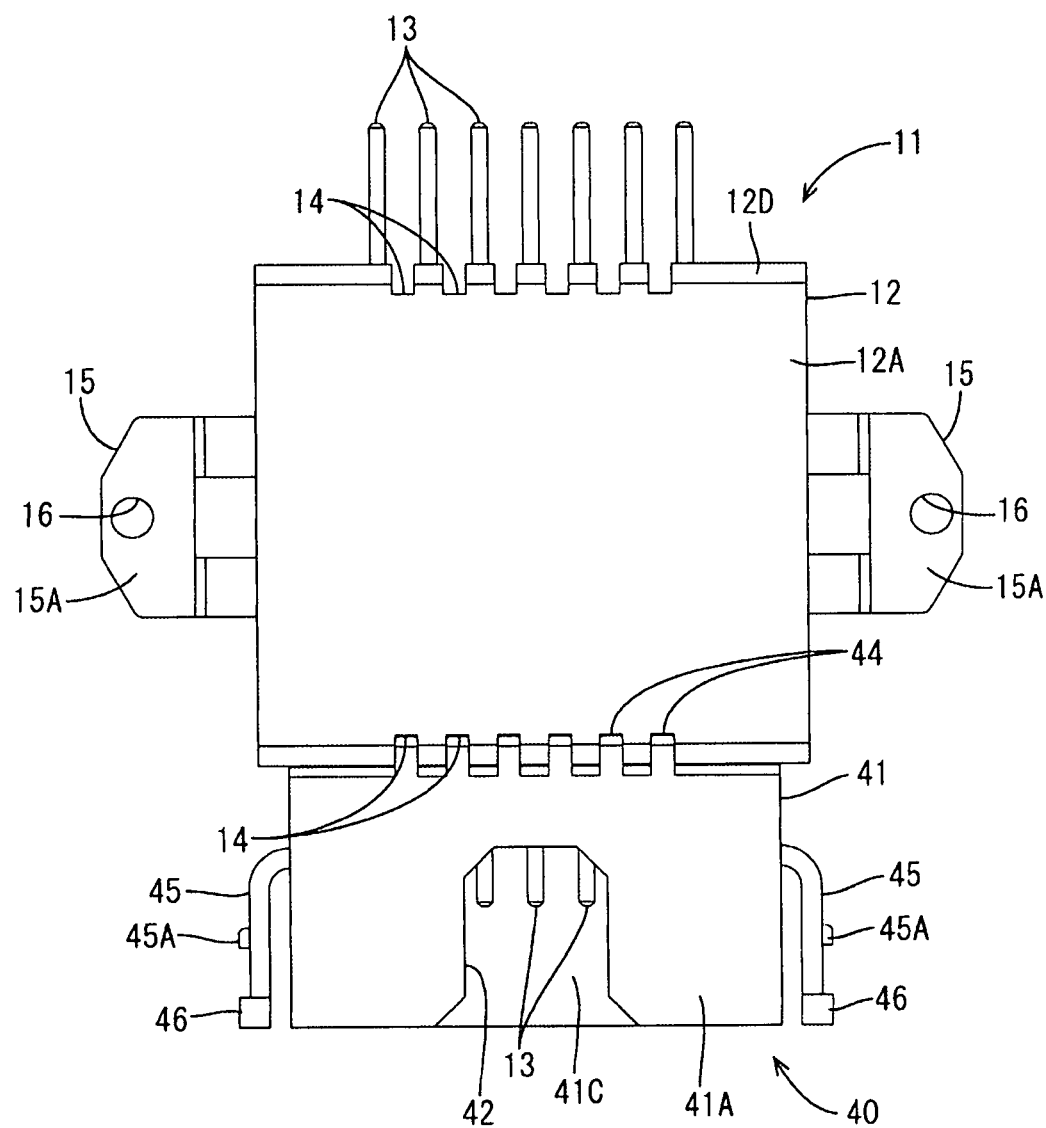
FIG. 16 is a plan view showing the fit state of the control circuit unit and the protection tube with the cover omitted.

A projecting dimension of the partition walls 44 from the rear end edge of the tubular portion 41 is equal to or slightly shorter than a depth of the unit-side grooves 14 of the body 12, and the rear end surface of the upper wall 41A of the tubular portion 41 and the front surface 12B of the body 12 butt against each other when the protection tube 40 is assembled with the control circuit unit 11 (see FIG. 16).

A thickness (lateral dimension) of each partition wall 44 is equal to or slightly less than a width of the respective unit-side groove 14. Thus, the partition walls 44 are just fit into the unit-side grooves 14 with almost no clearances therebetween when the protection tube 40 is assembled with the control circuit unit 11.

Furthermore, a height of the partition walls 44 is equal to that of the upper wall 41A of the tubular portion 41 (see FIG. 19), and the upper surfaces of the partition walls 44 and the upper wall 41A are below the inclined surface 12D of the body 12 when the protection tube 40 is assembled with the control circuit unit 11 (see FIG. 15).

Note that a projecting dimension and a thickness of the supporting wall 43 from the tubular portion 41 are set such that the supporting wall 43 is just fit to the step 12F of the body 12, i.e. the rear end surface of the supporting wall 43 butts against the front surface of the step 12F and the upper surface of the supporting wall 43 is overlapped below the lower surface of the step 12F when the protection tube 40 is assembled with the control circuit unit 11.

(Vehicle Connector 50)

The vehicle connector 50 is connected to the control circuit device 10 composed of the control circuit unit 11, cover 20 and protection tubes 40 and includes unillustrated vehicle-side terminals connected to unillustrated vehicle-side wires and a connector housing 51 for accommodating these vehicle-side terminals. In the following description, a connection direction to the control circuit device 10 is referred to as a forward direction and a separation direction from the control circuit device 10 is referred to as a rearward direction.

The connector housing 51 is made of synthetic resin and has a flat and substantially rectangular parallelepiped shape, and terminal accommodation chambers 52 open in the front-rear direction are formed laterally side by side. The vehicle-side terminals connected to the vehicle-side wires are inserted into the terminal accommodation chambers 52 from behind and are retained by butting portions 52A on a front end and by unillustrated locking lances.

A flange 53 protrudes out at the rear end of the connector housing 51. Further, the connector-side lock arm 54 is cantilevered rearward from the upper surface of the connector housing 51 at a substantially central part in the front-rear direction and from a widthwise center of the upper surface of the connector housing 51. The connector-side lock arm 54 extends up to the vicinity of the rear end edge of the connector housing 51. A lock protrusion 54A is provided on the upper surface of the connector-side lock arm 54 and is to be locked to the second lock hole 32 of the cover 20.

The protruding portion 55 protrudes up and laterally on a free rear end of the connector-side lock arm 54. The protruding portion 55 is used to unlock the connector-side lock arm 54. The back surface of the protruding portion 55 is in front of the back surface of the flange 53 (see FIG. 2). Further, an area of the above flange 53 where the protruding portion 55 is disposed is cut to allow the protruding portion 55 to escape (cutout portion 56).

Connector-side grooves 57 are recessed concavely rearward over the entire height of the front surface of the connector housing 51. The connector-side grooves 57 are between adjacent terminal accommodation chambers 52 of the connector housing 51, i.e. at positions corresponding to the partition walls 44 with the vehicle connector 50 and the control circuit device 10 connected.

Figure 20:
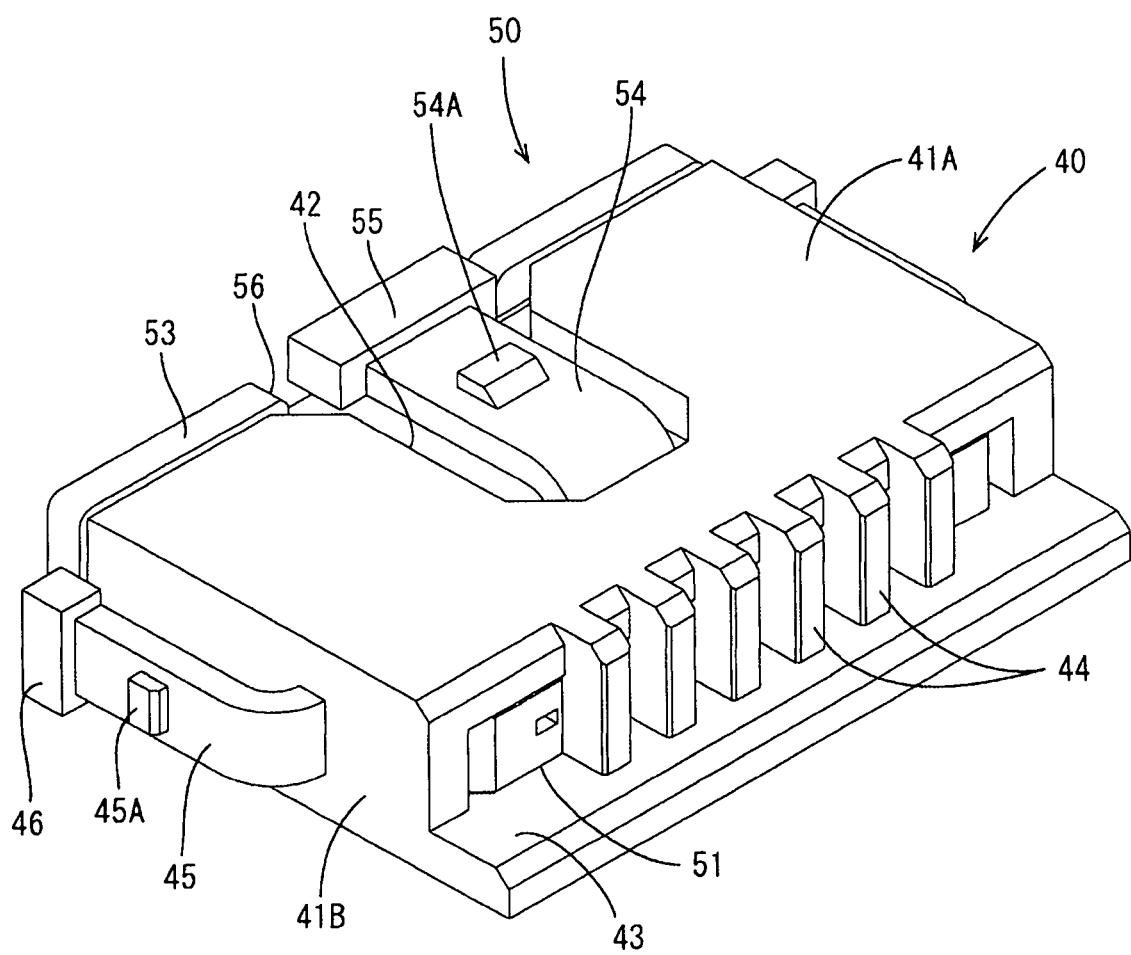
FIG. 20 is a perspective view showing a fit state of the protection tube and the vehicle connector with the cover and the control circuit unit omitted.
Figure 21:
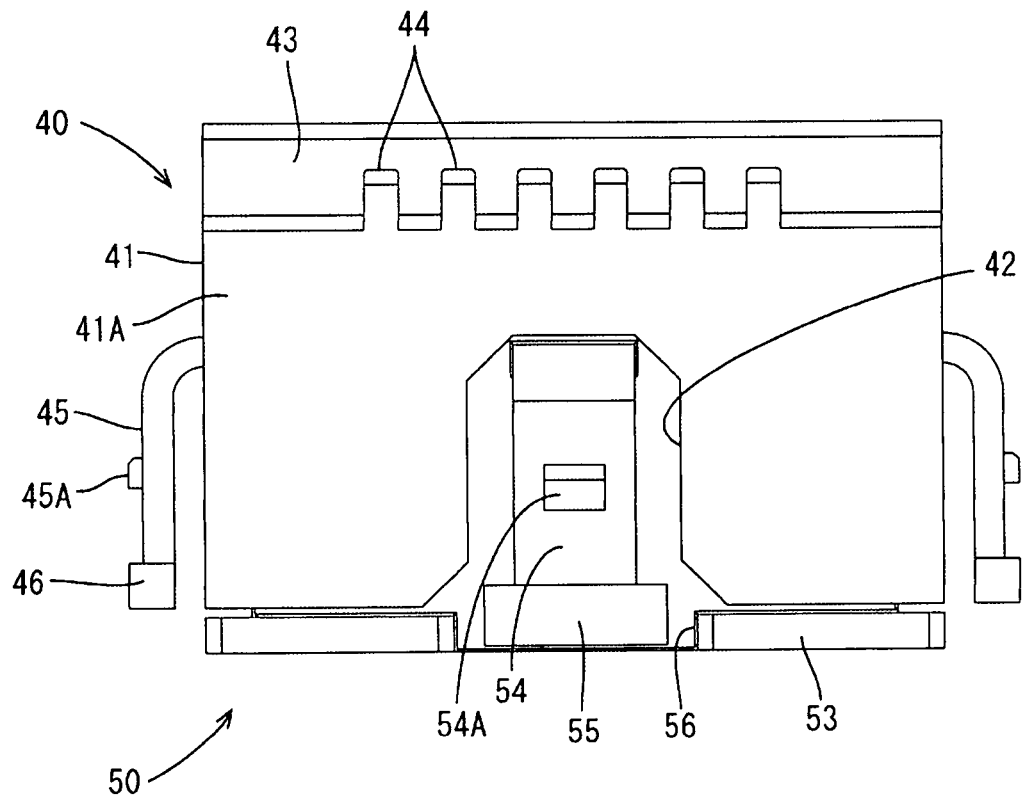
FIG. 21 is a plan view showing the fit state of the protection tube and the vehicle connector with the cover and the control circuit unit omitted.
Figure 22:
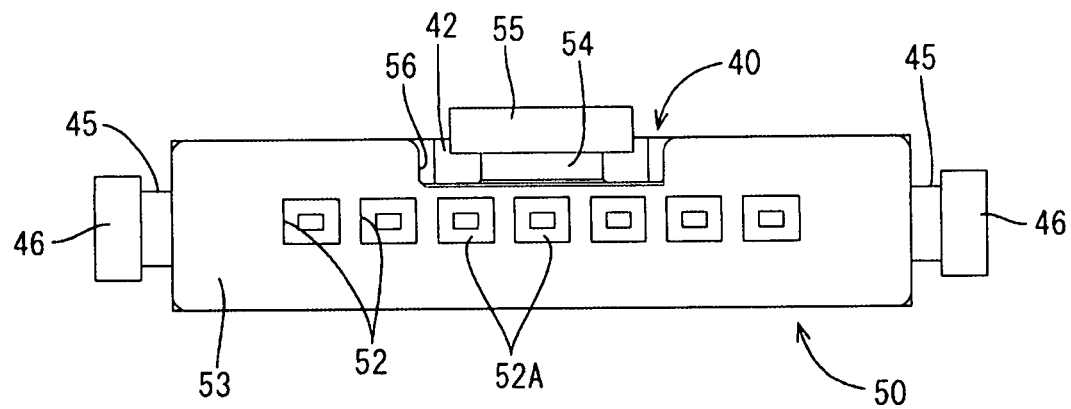
FIG. 22 is a front view showing the fit state of the protection tube and the vehicle connector with the cover and the control circuit unit omitted.
Figure 23:
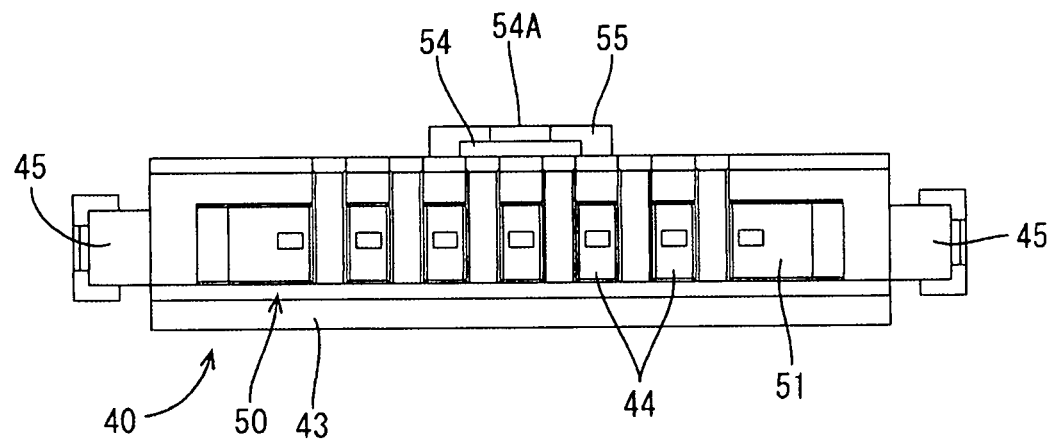
FIG. 23 is a back view showing the fit state of the protection tube and the vehicle connector with the cover and the control circuit unit omitted.
Figure 24:
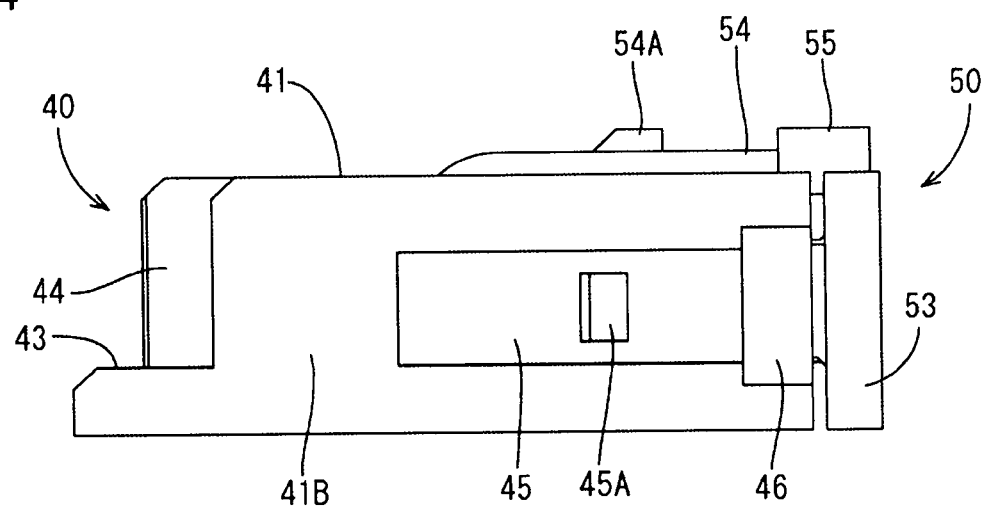
FIG. 24 is a left side view showing the fit state of the protection tube and the vehicle connector with the cover and the control circuit unit omitted.
Figure 25:
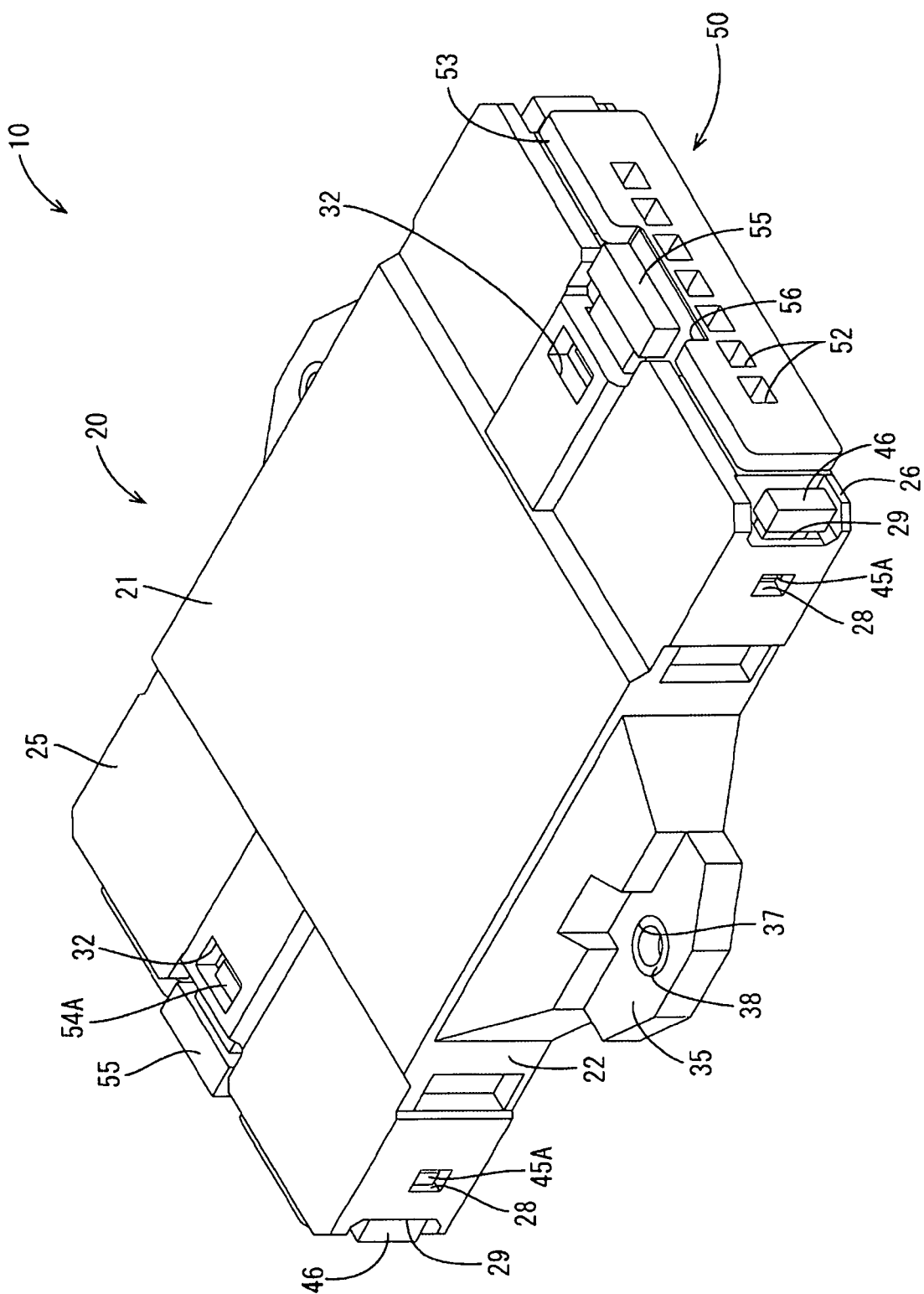
FIG. 25 is a perspective view showing a connected state of the control circuit device and the vehicle connector.
Figure 26:
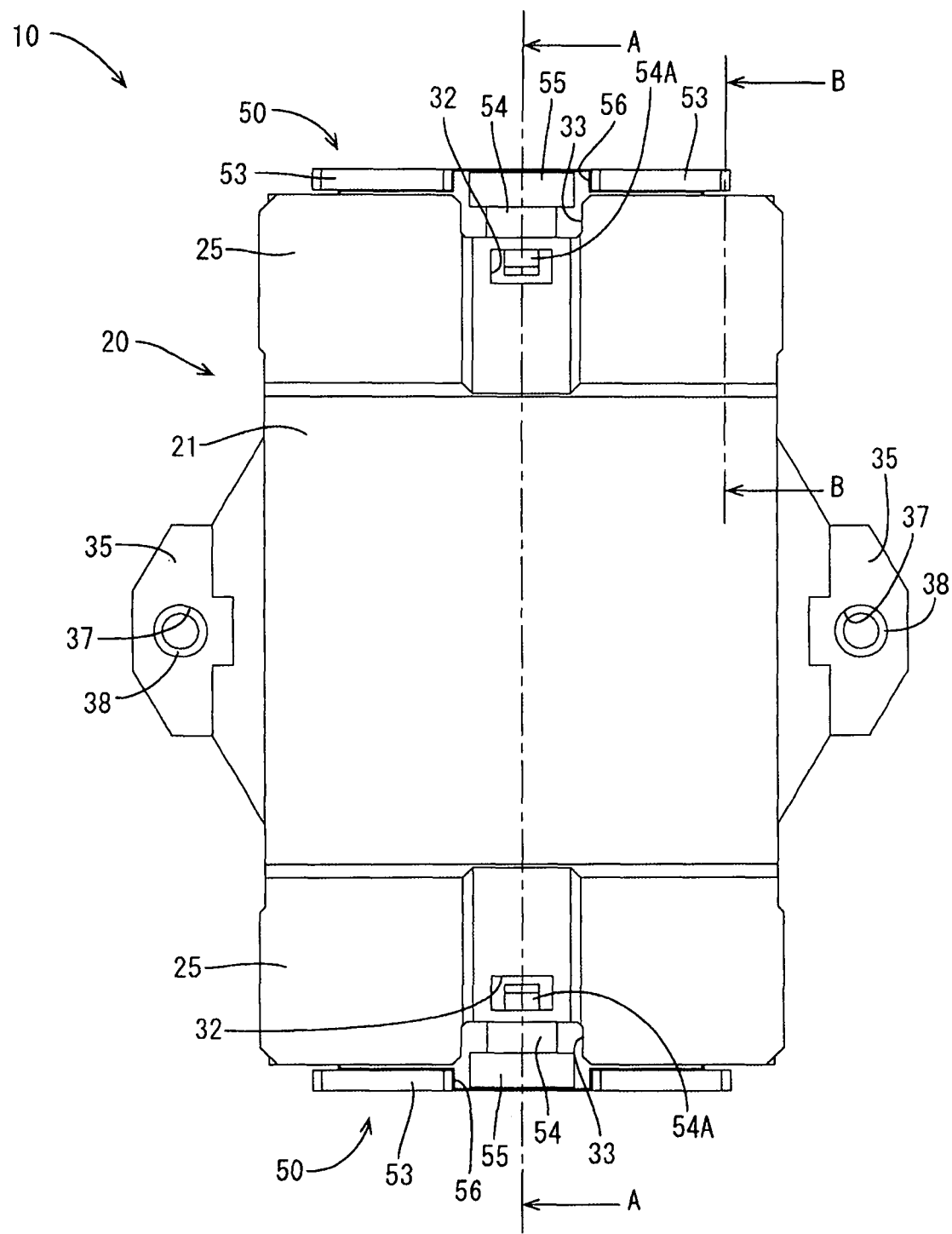
FIG. 26 is a plan view showing the connected state of the control circuit device and the vehicle connector.

With the vehicle connector 50 and the control circuit device 10 connected, front parts of the respective partition walls 44 disposed inward of the tubular portion 41 are fit in the respective connector-side grooves 57 (see FIGS. 19 and 20).

A width of each connector-side groove 57 is equal to or slightly greater than the thickness of the partition walls 44. Further, a depth of each connector-side groove 57 is equal to or slightly greater than a length in the front-rear direction of the parts of the partition walls 44 to be disposed inward of the tubular portion 41. Specifically, the partition walls 44 just fit into the connector-side grooves 57 with almost no clearances, and the front surface of the connector housing 51 and the back surface of the tubular portion 41 are disposed flush with each other (see FIG. 20).

Further, dimensions of the unit-side grooves 14, the partition walls 44 and the connector-side grooves 57 in the front-rear direction are set such that the front surface 12B of the control circuit unit 11 and the front surface of the vehicle connector 50 butt against each other with the vehicle connector 50 and the control circuit device 10 connected.

(Assembling Procedure of Control Circuit Device 10)

Next, an assembling procedure of the control circuit device 10 is described. In assembling the control circuit device 10 of this embodiment, the cover 20 is first turned upside down and the four corner parts of the body 12 of the control circuit unit 11 are aligned with the four positioning corners 24 on the underside of the cover 20 and the body 12 is accommodated into the accommodation recess 23 (see FIG. 12).

In this state, the unit-side mounting portions 15 of the control circuit unit 11 are accommodated closely into the mounting/accommodating portions 36 of the cover-side mounting portions 35. Further, the unit-side bolt insertion holes 16 and the cover-side bolt insertion holes 37 overlap. Further, the terminals 13 face the protection tube holding portions 25 of the ceiling wall 21 in parallel.

Note the control circuit unit 11 and the cover 20 are positioned in this state but are not fixed.

Figure 10:
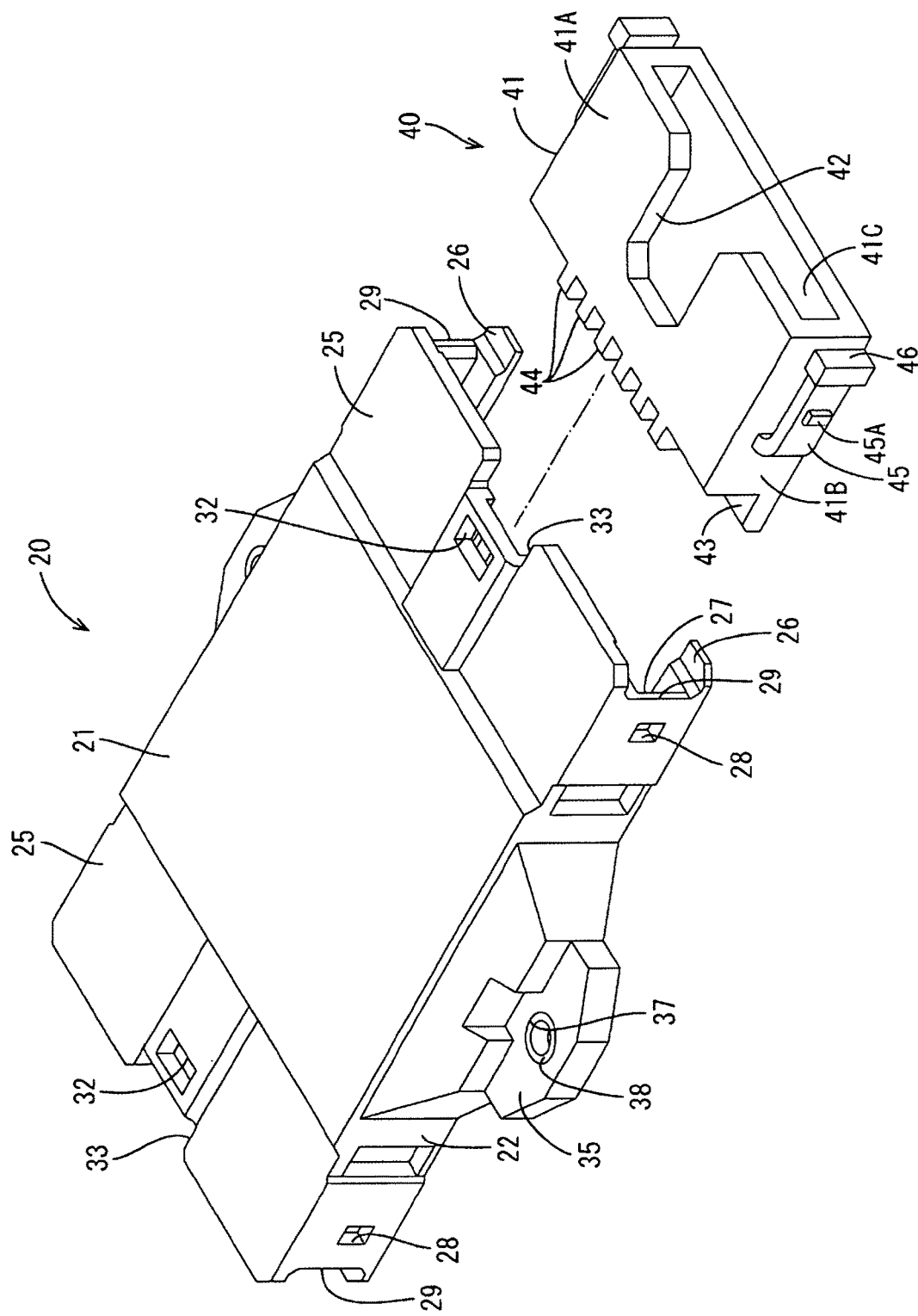
FIG. 10 is a perspective view showing the process of fitting the cover and the control circuit unit in the assembled state and the protection tube.
Figure 12:
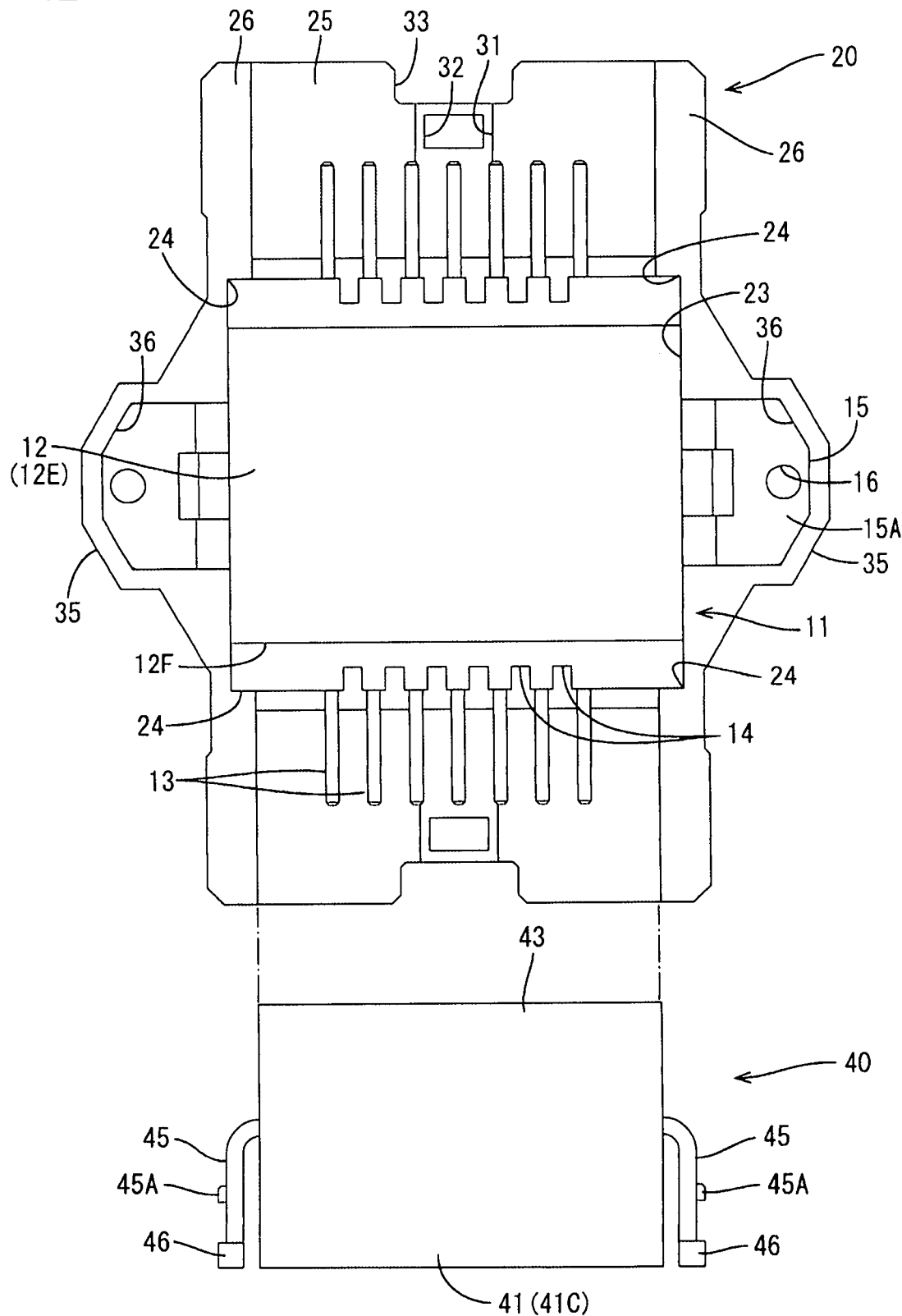
FIG. 12 is a bottom view showing the process of fitting the cover and the control circuit unit in the assembled state and the protection tube.
Figure 13:
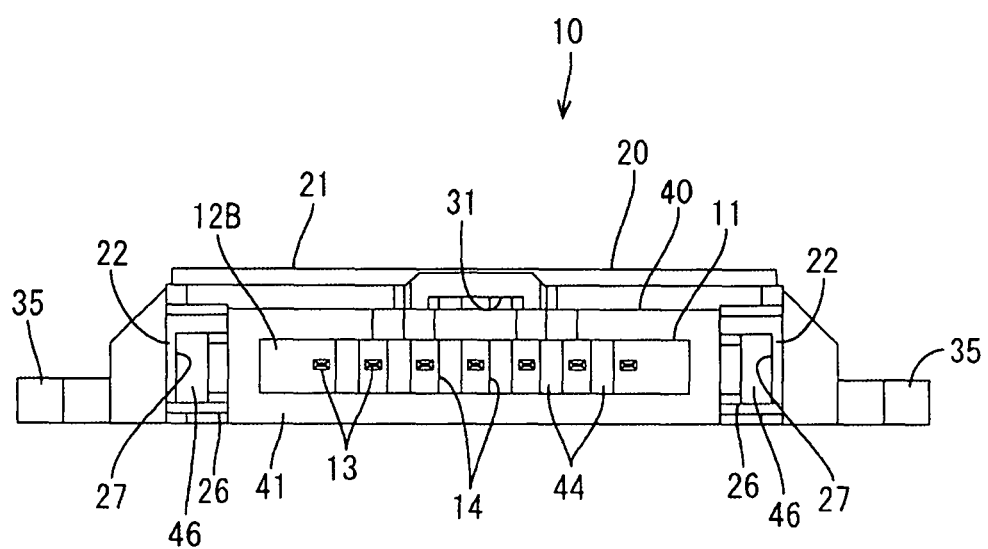
FIG. 13 is a front view of the control circuit device.

Subsequently, the protection tubes 40 are brought closer and fit with the partition walls 44 in the lead from the front and rear sides of the control circuit unit 11 and the cover 20 positioned each other (see FIGS. 10 to 12). The protection tube 40 is inserted into the protection tube holding portion 25 such that the upper wall 41A of the tubular portion 41 slides along the ceiling wall 21 of the cover 20 (note that although views viewed from above are shown in FIGS. 10 and 11 for the sake of convenience, it is actually preferable that the protection tubes 40 are fit with the cover 20 turned upside down as shown in FIG. 12).

The lock arms 45 enter the first accommodation grooves 27 and gradually deform inward as the protection tube 40 is inserted into the protection tube holding portion 25. The lock protrusions 45A move over edges of the first lock holes 28 as the protection tube 40 is fit farther. Thus, the lock arms 45 resiliently return and the lock protrusions 45A and the first lock holes 28 engage (example of locking means), so that the protection tube 40 is fit properly (see FIGS. 17 and 18).

Figure 15:
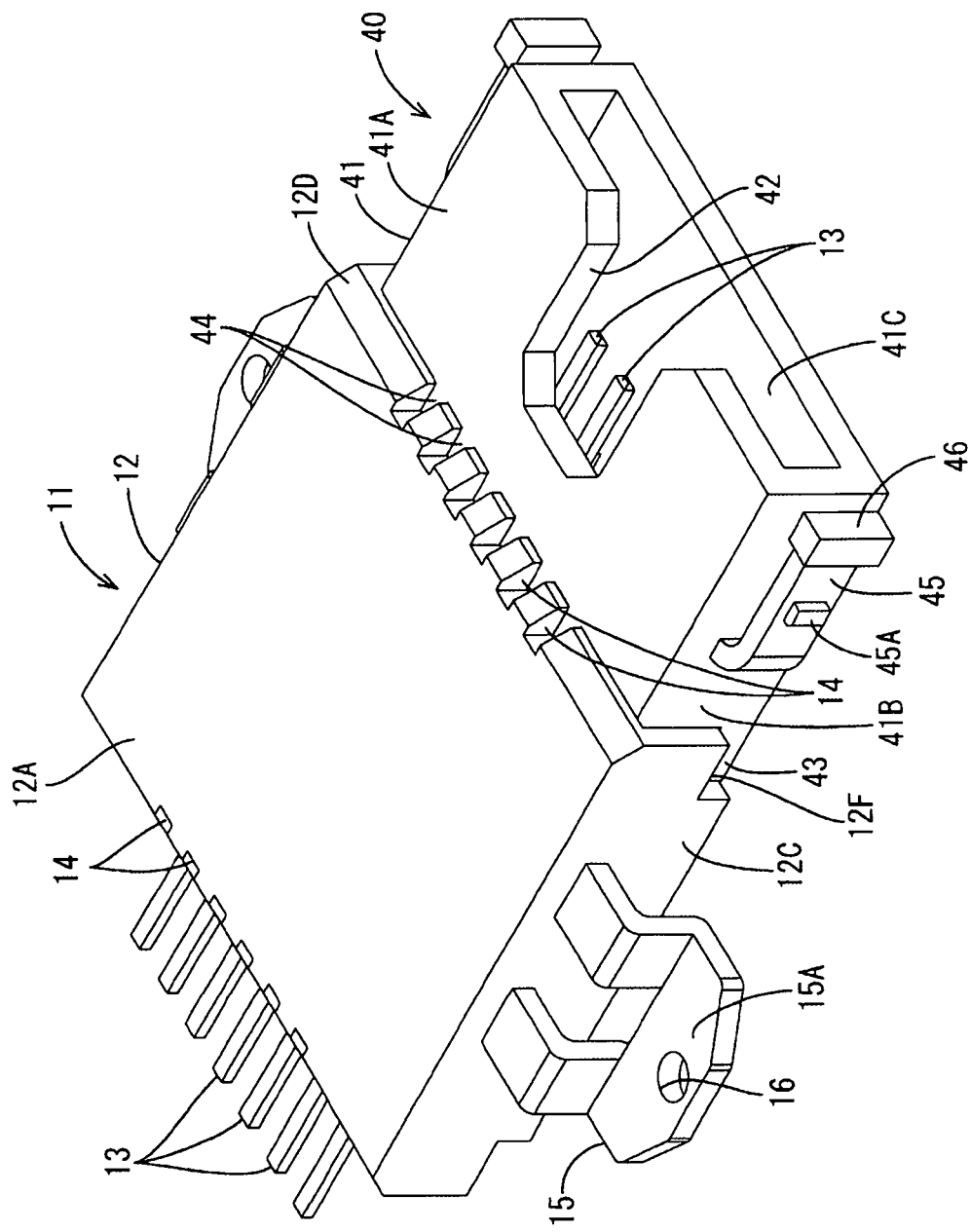
FIG. 15 is a perspective view showing a fit state of the control circuit unit and the protection tube with the cover omitted.

The partition walls 44 of the protection tube 40 are inserted into the unit-side grooves 14 of the body 12 of the control circuit unit 11 in this fitting process, and the partition walls 44 fit in the unit-side grooves 14 with almost no clearances, as shown in FIGS. 15 and 16, in the properly fit state. Further, the side surface 12B of the body 12 and the back surface of the tubular portion 12 overlap with almost no clearances therebetween. Furthermore, the supporting wall 43 of the protection tube 40 is just fit to the step 12F of the body 12 (see FIGS. 15 and 27).

In this fit state, the tubular portion 41 collectively surrounds and covers the terminals 13. Further, a region with the escaping portion 42 is covered by the cover 20 and the terminals 13 are not exposed.

In this way, the control circuit device 10 is assembled. In such an assembled state, the terminals 13 of the control circuit unit 11 are arranged in parallel to the upper wall 41A and the bottom wall 41C of the tubular portion 41.

Although the control circuit unit 11 and the cover 20 are not locked to each other, but are positioned by fitting the four corners of the body 12 into the positioning corners 24 of the accommodation recess 23. Further, these are positioned by accommodating the unit-side mounting portions 15 of the control circuit unit 11 into the mounting/accommodating portions 36 of the cover-side mounting portions 35.

Further, the control circuit unit and the protection tube 40 are positioned by fitting the partition walls 44 into the unit-side grooves 14 and fitting the supporting wall 43 to the step 12F even though the control circuit unit and the protection tube 40 are not locked to each other.

Furthermore, the cover 20 and the protection tube 40 are locked to each other by locking the lock protrusions 45A of the lock arms 45 of the protection tube 40 into the first lock holes 28 of the cover 20.

The control circuit unit 11 is sandwiched by the cover 20 and the protection tube 40 and held positioned with the cover 20 and the protection tube 40 locked thereto.

(Connection of Control Circuit Device 10 and Vehicle Connector 50)

The control circuit device 10 in the assembled state is connected to the vehicle connector 50 at a mounting site where the control circuit device 10 is mounted into a vehicle.

Figure 17:
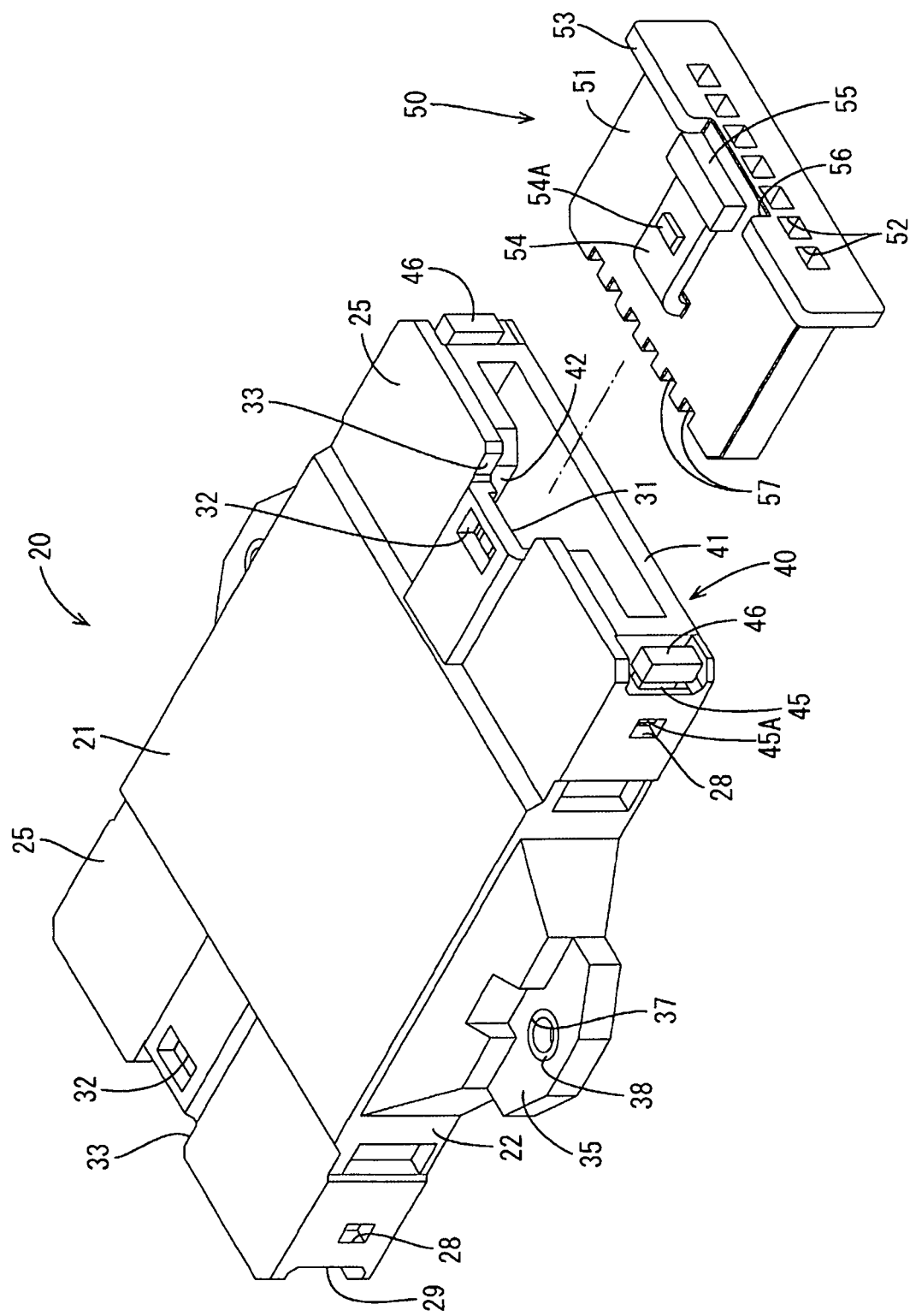
FIG. 17 is a perspective view showing the process of connecting the control circuit device and the vehicle connector.
Figure 18:
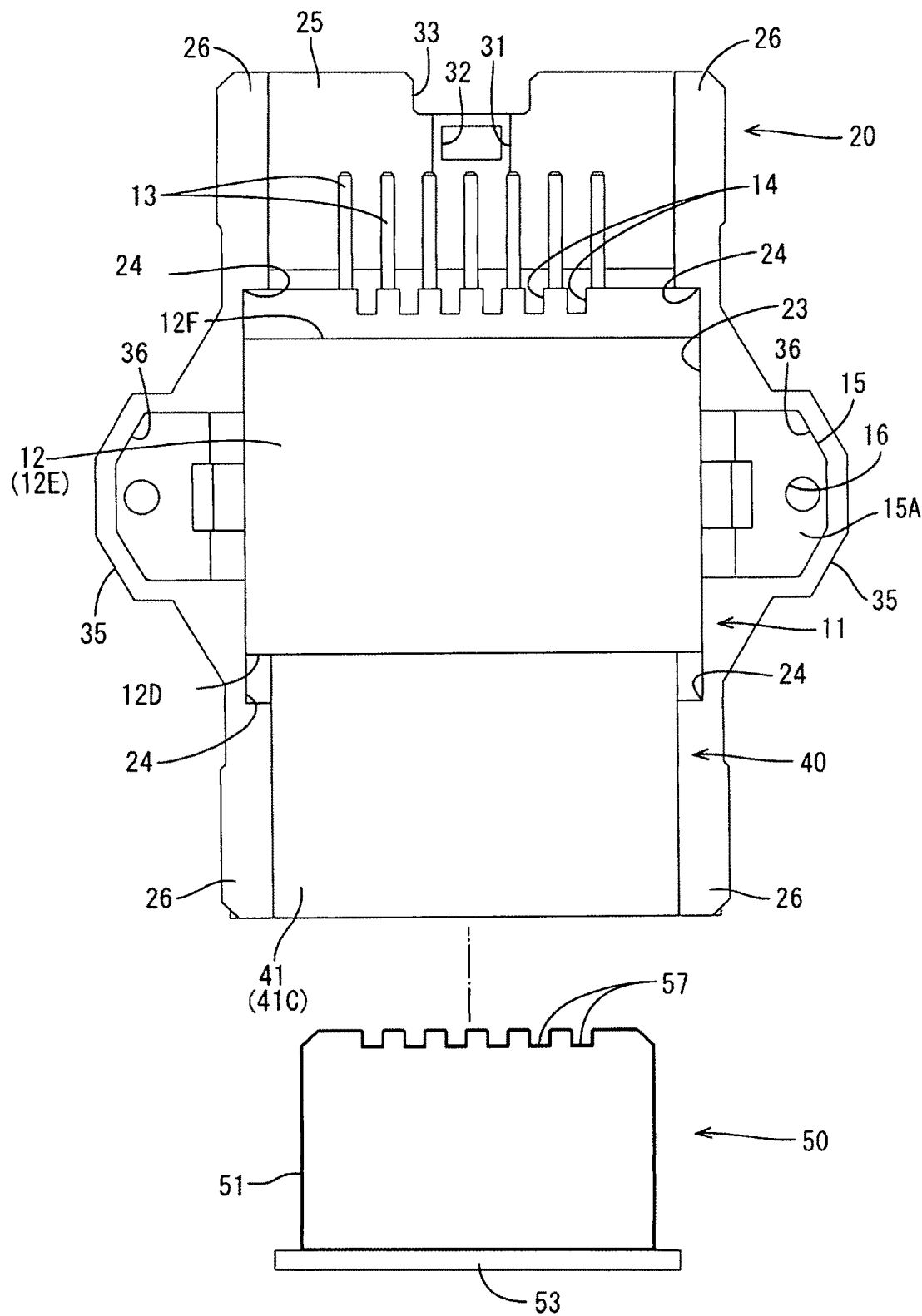
FIG. 18 is a bottom view showing the process of connecting the control circuit device and the vehicle connector.

In connecting the vehicle connector 50 to the control circuit device 10, the vehicle connector 50 having the unillustrated vehicle-side terminals accommodated therein is brought closer to the control circuit device 10 from the front in the connection direction and is inserted into the protection tube 40 (see FIGS. 17 and 18).

The connector-side lock arm 54 of the vehicle connector 50 then is inserted into the escaping portion 42 of the protection tube 40 and the second accommodation groove 31 of the cover 20 with a base end side of the connector-side lock arm 54 in the lead, and gradually is pushed down by the ceiling 21 (bottom part of the second accommodation groove 31).

The vehicle connector 50 is inserted farther so that the rear end of the lock protrusion 54A of the connector-side lock arm 54 reaches an edge of the second lock hole 32. Thus, the connector-side lock arm 54 resiliently returns and the control circuit device 10 and the vehicle connector 50 are locked. Specifically, the vehicle connector 50 is retained and held in the control circuit device 10. In this state, the protruding portion 55 provided on the free end of the connector-side lock arm 54 is accommodated in the second cutout recess 33 of the cover 20 (see FIGS. 25 and 26).

By this connection, the parts of the partition walls 44 disposed inward of the tubular portion 41 are fit into the connector-side grooves 57 of the connector housing 51 inside the tubular portion 41 as shown in FIGS. 19 and 20.

Figure 27:
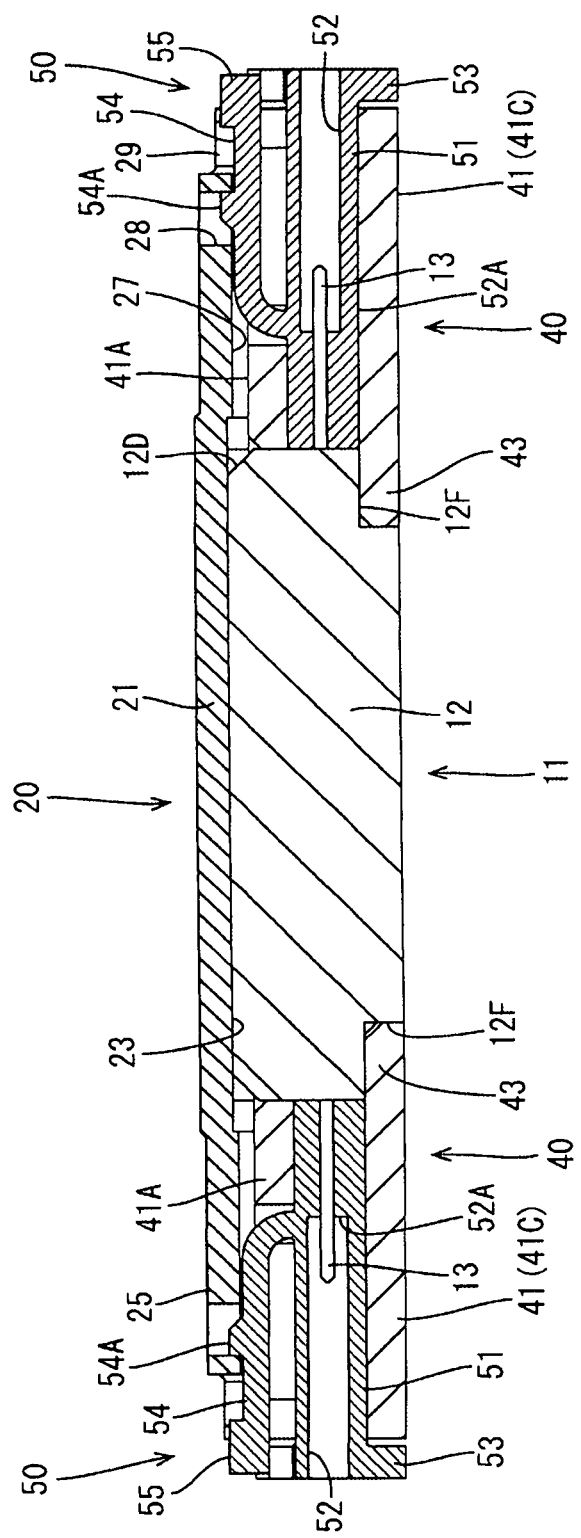
FIG. 27 is a section along A-A of FIG. 26.
Figure 28:
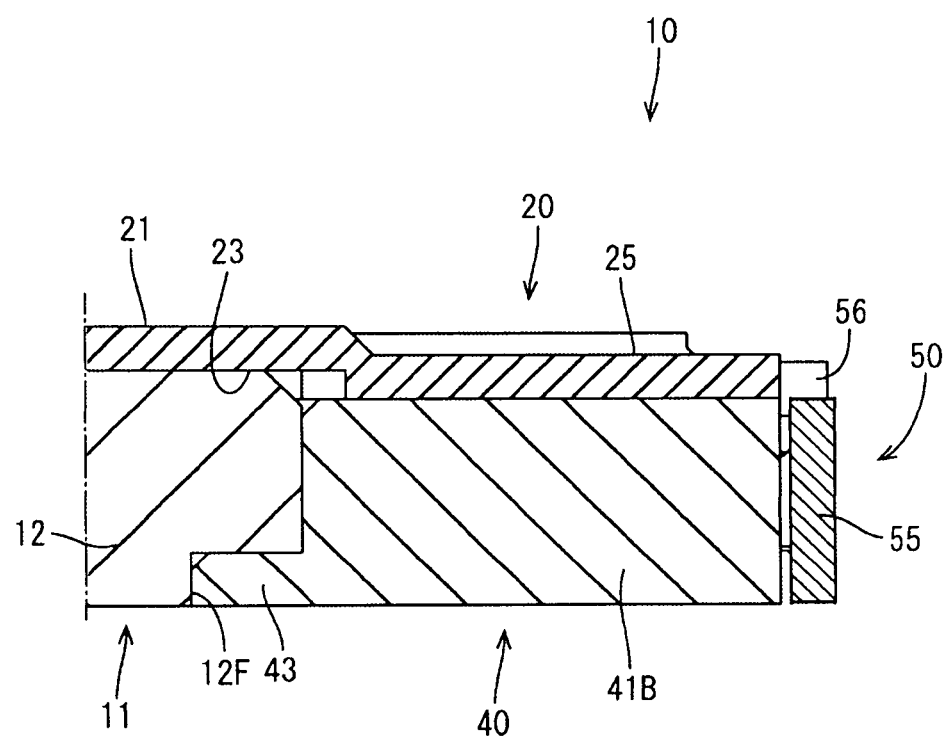
FIG. 28 is a section along B-B of FIG. 26.
Figure 29:
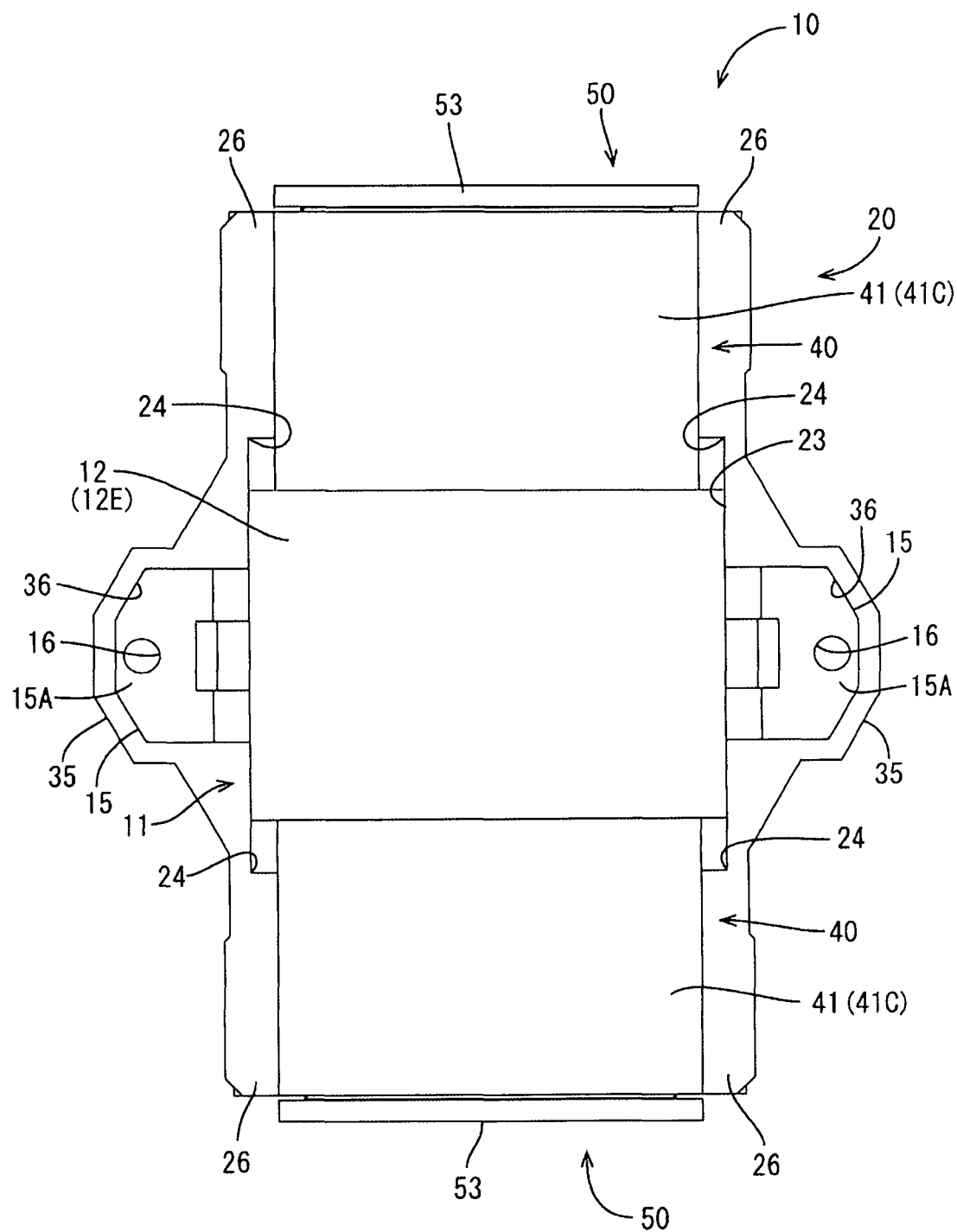
FIG. 29 is a bottom view showing the connected state of the control circuit device and the vehicle connector.
Figure 30:
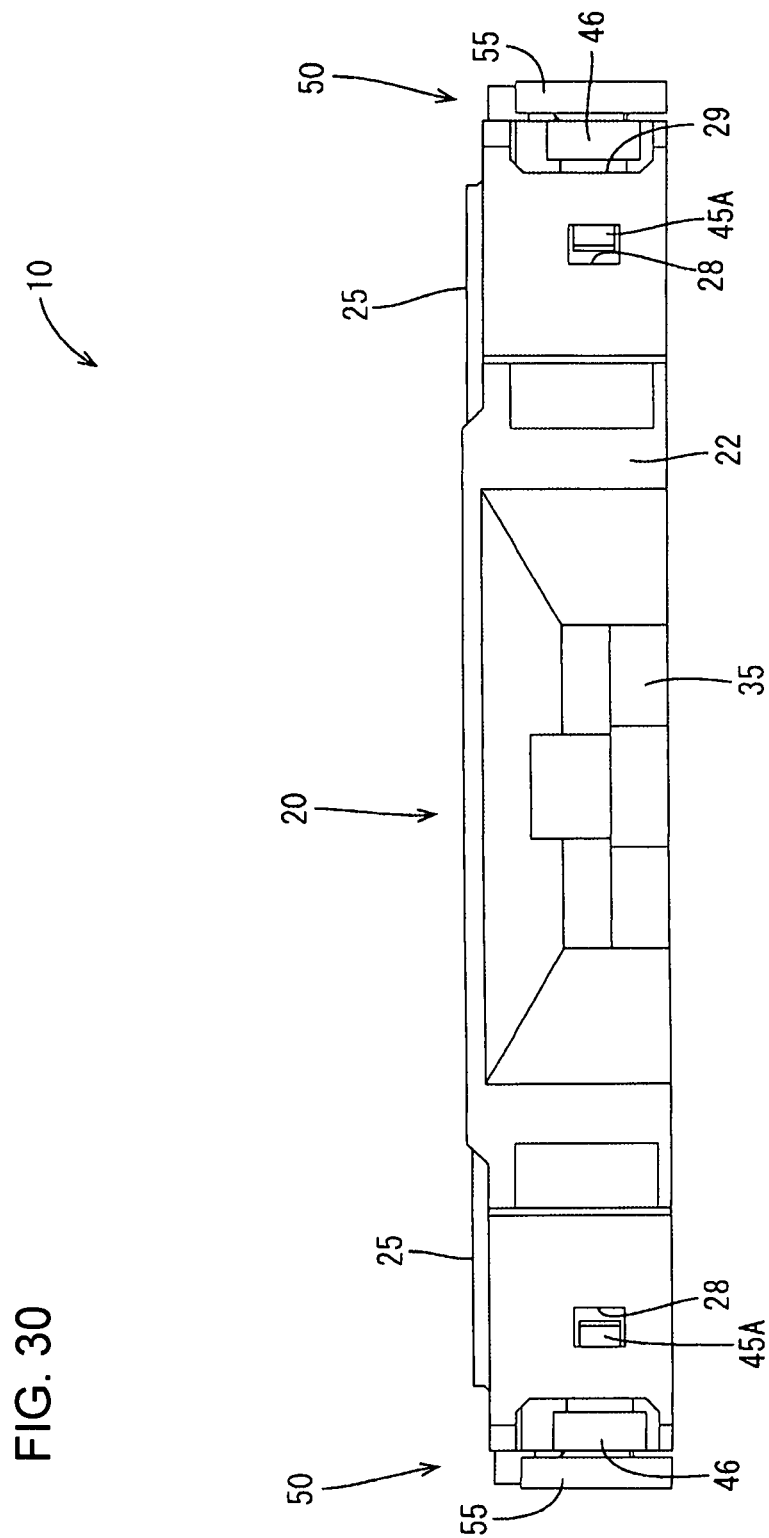
FIG. 30 is a left side view showing the connected state of the control circuit device and the vehicle connector.
Figure 31:
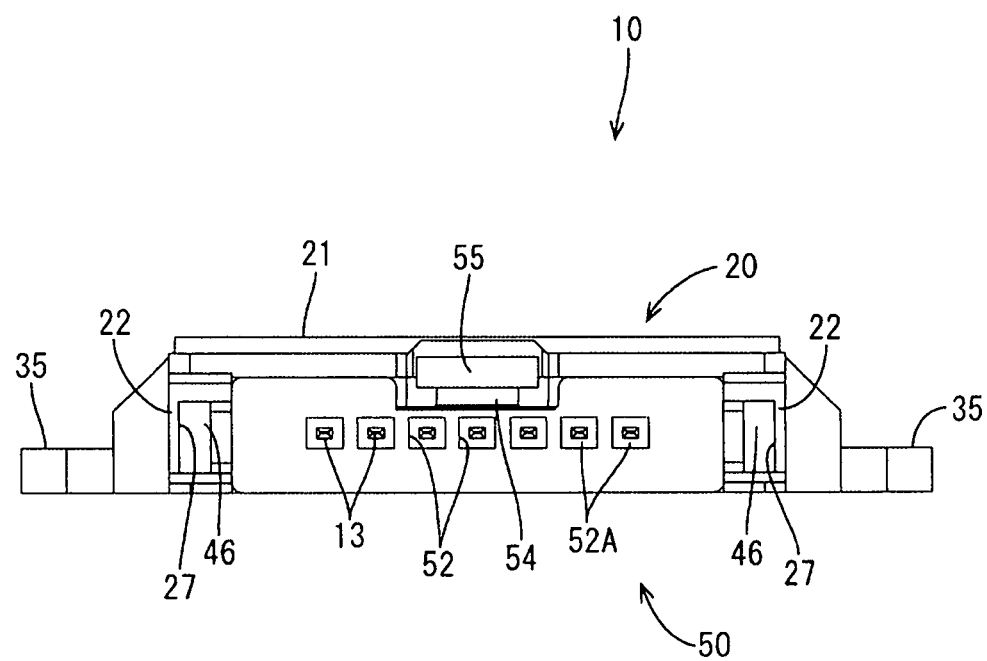
FIG. 31 is a front view of the connected state of the control circuit device and the vehicle connector.

Further, the terminals 13 enter the terminal accommodation chambers 52 of the vehicle connector 50 and electrically connect to the unillustrated vehicle-side terminals (see FIG. 27).

In this way, the control circuit device 10 and the vehicle connector 50 are connected.

(Mounting of Control Circuit Device 10)

Figure 32:
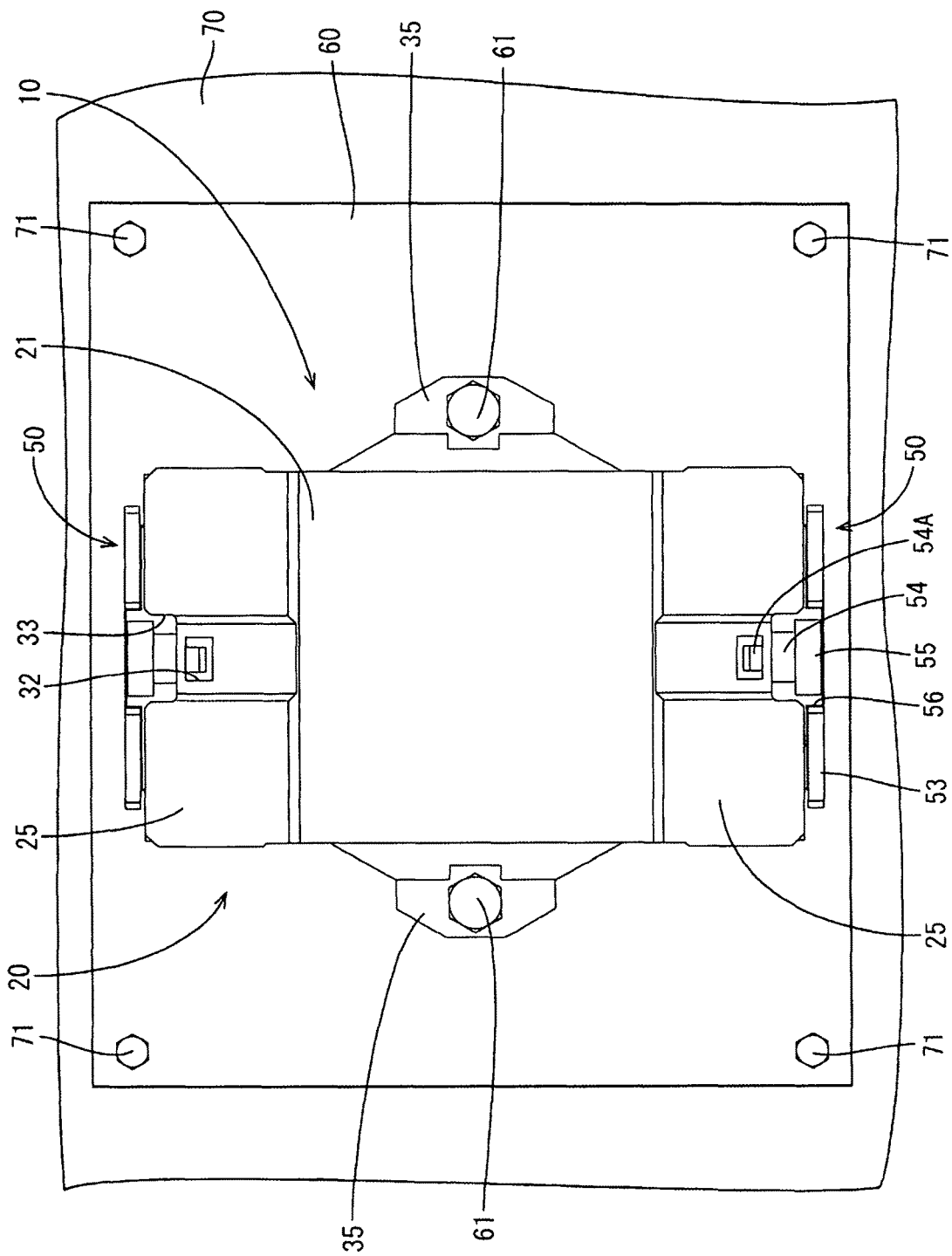
FIG. 32 is a plan view showing a state where the control circuit device having the vehicle connectors connected thereto is mounted in a vehicle automatic transmission.

The control circuit device 10 having the vehicle connectors 50 connected thereto is mounted on a base 60 (example of a mounted member) made of a metal plate material. Specifically, as shown in FIG. 32, the unit-side bolt insertion holes 16 and the cover-side bolt insertion holes 37 of the control circuit device 10 overlapped in advance are overlapped on fixing holes (not shown) of the base 60 for the control circuit device 10 and the control circuit device 10 is fixed by fastening bolts 61 (example of a fastening member).

Finally, the base 60 having the control circuit device 10 fixed thereto is fixed at a predetermined mounting location of an automatic transmission 70 of a vehicle by fastening bolts 71.

According to the control circuit device 10 of the embodiment, the control circuit unit 11 can be assembled while being held with respect to the cover 20 and the protection tubes 40. In such an assembled state, the protection tubes 40 collectively cover and surround the terminals 13 of the control circuit unit 11 so that foreign matter cannot contact and deform the terminals 13 during transportation.

Further, at the mounting site of the control circuit device 10, it is sufficient to collectively mount the control circuit unit 11, the cover 20 and the protection tubes 40 assembled in this way on the base 60. Thus, the number of components and the number of working steps at the mounting site can be reduced.

Further, even if the control circuit device 10 is mounted on the base 60, the of terminals 13 are covered collectively around by the insulating protection tubes 40 and are not arranged to face the base 60. Thus, a short circuit between the terminals 13 and the base 60 can be prevented. Furthermore, since the partition walls 44 are disposed between the terminals 13, a short circuit between adjacent the terminals 13 can also be suppressed.

Further, the positioning of the control circuit unit 11 with respect to the protection tubes 40 can be realized by providing the protection tubes 40 with the partition walls 44 provided on the protection tubes 40 and the supporting walls 43 for covering parts of the body 12 from below.

Further, in the control circuit device 10 of this embodiment, the body 12 is provided with the unit-side grooves 14 into which edges of the partition walls 44 are fit, and the edges of the partition walls 44 are fit in the unit-side grooves 14 with the control circuit unit 11, the cover 20 and the protection tubes 40 assembled. Thus, a creepage distance between adjacent terminals 13 becomes longer and the short circuit between the terminals is less likely to occur.

Further, the control circuit unit 11 includes the unit-side mounting portions 15, the cover 20 includes the cover-side mounting portions 35, and the unit-side mounting portions 15 and the cover-side mounting portions 35 are fastened collectively to the base 60 by the bolts 61 while being overlapped. Accordingly, the cover 20 and the control circuit unit 11 are fastened collectively to the base 60 by the bolts 61 so that the protection tubes 40 locked to the cover 20 also are mounted collectively.

Simultaneously, the cover 20 and the control circuit unit 11 are fixed to each other. Specifically, since fixing means for fixing the cover 20 and the control circuit unit 11 to each other can double as mounting means for mounting the control circuit device 10 on the base 60, the overall configuration can be simplified and the number of working steps can be reduced.

Further, the cover-side mounting portions 35 are provided on the cover 20 different from the protection tubes 40 formed with the partition walls 44. Thus, the configurations of the cover 20 and the protection tubes 40 can be simplified and molding is easier as compared to a configuration for providing the partition walls 44 and the mounting portions on either the cover 20 or the protection tubes 40.

The vehicle connector 50 is provided with the connector-side grooves 57 into which the edges of the partition wall 44 are fit in the state connected to the control circuit device 10, the creepage distance between adjacent ones of the terminals 13 becomes longer also on the side of the vehicle connector 50 and the short circuit is less likely.

As just described, it is possible to transport the terminals 13 in a protected state, collectively mount the terminals 13 on the base 60 and obtain the control circuit device 10 for vehicle automatic transmission in which a short circuit is unlikely to occur. Further, the vehicle connector 50 can be obtained in which a short circuit is unlikely to occur.

The invention is not limited to the above described and illustrated embodiment. For example, the following embodiments also are included in the scope of the invention.

Although the control circuit unit 11 is placed and positioned on the cover 20 turned upside down in the above embodiment, the control circuit unit and the cover 20 may be positioned by fitting the cover 20 on the control circuit unit 11 and the assembling method is not limited to the one in the above embodiment.

Although the control circuit device 10 is mounted on the base 60 after the vehicle connectors 50 are connected to the control circuit device 10 in the above embodiment, the control circuit device 10 may be mounted on the base 60 before the vehicle connectors 50 are connected and, thereafter, the vehicle connectors 50 may be connected. An operation procedure is not limited to the one in the above embodiment.

Although the cover-side mounting portions 35 are provided on the cover 20 in the above embodiment, mounting portions may be provided on the protection tubes 40 instead of the cover-side mounting portions 35.

Although the unit-side mounting portions 15 and the cover-side mounting portions 35 are overlapped in the above embodiment, the unit-side mounting portions 15 and the cover-side mounting portions 35 may be separately fixed to the base member 60 without being overlapped.

The method for fixing the control circuit device 10 to the base member 60 is not limited to the one in the above embodiment.

Although the cover 20 covers the entire control circuit unit 11 in the above embodiment, the cover 20 may not necessarily cover the entire control circuit unit 11. The cover 20 may be configured to be at least lockable to the protection tubes 40 and capable of holding the control circuit unit 11 together with the protection tubes 40. Further, the cover 20 or the protection tubes 40 may be configured to be able to lock the connect state to the vehicle connectors 50.

Although the body 12 is provided with the unit-side grooves 14, into which the partition walls 44 are fit, in the above embodiment, the unit-side grooves 14 may be omitted. Further, the connector-side grooves 57 of the vehicle connectors 50 may also be omitted. Either the body 12 or the vehicle connectors 50 may be provided with the grooves and the grooves of the other(s) may be omitted.

The positioning means for positioning the control circuit unit 11 with respect to the cover 20 is not limited to the one in the above embodiment and any configuration can be adopted if positioning is possible.

The locking means for locking the cover 20 and the protection tubes 40 is also not limited to the one in the above embodiment and can be changed as appropriate.

LIST OF REFERENCE SIGNS

10: control circuit device
11: control circuit unit
12: body
13: terminal
14: unit-side groove (fitting groove)
15: unit-side mounting portion
20: cover
23: accommodation recess
24: positioning corner (positioning means)
25: protection tube holding portion
27: first accommodation groove
28; first lock hole (locking means)
31: second accommodation groove
32: second lock hole
35: cover-side mounting portion
36: mounting/accommodating portion (positioning means)
40: protection tube
43: supporting wall (positioning means)
44: partition wall (positioning means)
45: lock arm
45A: lock protrusion (locking means)
50: vehicle connector
51: connector housing
57: connector-side groove
60: base (mounted member)
61: bolt (fastening member)
70: automatic transmission
X: arrangement direction
Y: intersection direction

The invention claimed is:

1. A control circuit device for vehicle automatic transmission, comprising:
   a control circuit unit including a body having a built-in control circuit for vehicle automatic transmission and tab-like terminals extending from the body while being aligned in an arrangement direction;
   a cover configured to cover the control circuit unit from one side in an intersection direction intersecting the arrangement direction; and
   an insulating protection tube having a rear end configured to collectively surround the terminals, the rear end being provided with partition walls to be disposed between adjacent ones of the terminals, the protection tube further having an open front end and an interior extending from the front end toward the rear end for receiving a vehicle connector to be connected to the terminals of the control circuit unit;
   the cover and the protection tube including locking means configured to lock the cover and the protection tube to each other and positioning means configured to position the control circuit unit; and
   the control circuit unit being held positioned with respect to the cover and the protection tube with the cover and the protection tube locked by the locking means.

2. The control circuit device for vehicle automatic transmission of claim 1, wherein the positioning means on the side of the protection tube includes the partition walls and a supporting wall configured to cover at least a part of the body from the other side in the intersection direction.

3. The control circuit device for vehicle automatic transmission of claim 2, wherein the body is provided with unit-side groove into which edge of the partition walls are fit.

4. The control circuit device for vehicle automatic transmission of claim 3, wherein:
the control circuit unit includes a unit-side mounting portion configured to mount the control circuit unit on a mounted member and the cover includes a cover-side mounting portion configured to mount the cover on the mounted member; and
the unit-side mounting portion and the cover-side mounting portion are collectively fastened to the mounted member by a fastening member while being overlapped on each other.

5. A vehicle connector to be connected to the control circuit device for vehicle automatic transmission of claim 4, comprising:
connector-side grooves into which end edges of the partition walls are fit with the vehicle connector connected to the control circuit device.

6. The control circuit device for vehicle automatic transmission of claim 1, wherein the body is provided with unit-side groove into which edge of the partition walls are fit.

7. The control circuit device for vehicle automatic transmission of claim 1, wherein:
the control circuit unit includes a unit-side mounting portion configured to mount the control circuit unit on a mounted member and the cover includes a cover-side mounting portion configured to mount the cover on the mounted member; and
the unit-side mounting portion and the cover-side mounting portion are collectively fastened to the mounted member by a fastening member while being overlapped on each other.

8. A connector assembly to be connected to the control circuit device for vehicle automatic transmission, comprising:
a control circuit unit including a body having a built-in control circuit for a vehicle automatic transmission and tab-like terminals extending from the body while being aligned in an arrangement direction;
a cover configured to cover the control circuit unit from one side in an intersection direction intersecting the arrangement direction;
an insulating protection tube configured to collectively surround the terminals and provided with partition walls to be disposed between adjacent ones of the terminals;
the cover and the protection tube including locking means configured to lock the cover and the protection tube to each other and positioning means configured to position the control circuit unit, the control circuit unit being held positioned with respect to the cover and the protection tube with the cover and the protection tube locked by the locking means; and
a vehicle connector insertable into an end of the protection tube opposite the partition walls and having connector-side grooves into which end edges of the partition walls are fit with the vehicle connector connected to the control circuit device.

* * * * *